(12) United States Patent
Yamamoto et al.

(10) Patent No.: US 9,400,427 B2
(45) Date of Patent: Jul. 26, 2016

(54) METHOD OF MANUFACTURING FINE STRUCTURE BODY AND FINE STRUCTURE MOLD

(75) Inventors: Yuji Yamamoto, Osaka (JP); Toshihiko Wada, Osaka (JP); Yoshifumi Takasu, Osaka (JP); Akihisa Yamada, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 540 days.

(21) Appl. No.: 13/821,379

(22) PCT Filed: Apr. 26, 2012

(86) PCT No.: PCT/JP2012/002863
§ 371 (c)(1),
(2), (4) Date: Mar. 7, 2013

(87) PCT Pub. No.: WO2012/164824
PCT Pub. Date: Dec. 6, 2012

(65) Prior Publication Data
US 2013/0161869 A1 Jun. 27, 2013

(30) Foreign Application Priority Data
Jun. 3, 2011 (JP) ................. 2011-125227

(51) Int. Cl.
*B29C 59/02* (2006.01)
*G03F 7/00* (2006.01)
*B82Y 10/00* (2011.01)
*B82Y 40/00* (2011.01)
*B29C 33/42* (2006.01)

(52) U.S. Cl.
CPC .............. *G03F 7/0002* (2013.01); *B29C 59/02* (2013.01); *B82Y 10/00* (2013.01); *B82Y 40/00* (2013.01); *B29C 33/42* (2013.01)

(58) Field of Classification Search
CPC ........ B29C 33/42; B29C 59/02; B82Y 10/00; B82Y 40/00; G03F 7/0002
USPC .................................. 264/319, 293
See application file for complete search history.

(56) References Cited

U.S. PATENT DOCUMENTS 5,259,926 A * 11/1993 Kuwabara et al. .............. 216/54
5,772,905 A    6/1998 Chou
(Continued)

FOREIGN PATENT DOCUMENTS

JP   2007-230229 A    9/2007
JP   2010-80670 A     4/2010
(Continued)

OTHER PUBLICATIONS

International Search Report for PCT/JP2012/002863, Jul. 10, 2012.

*Primary Examiner* — Alison L Hindenlang
*Assistant Examiner* — Robert J Grun
(74) *Attorney, Agent, or Firm* — RatnerPrestia

(57) ABSTRACT

The present invention is a method of manufacturing a fine structure body which manufactures the fine structure body by repeating a basic fine structure body forming step that forms a basic fine structure body by pressing a fine structure mold against a curable resin (photocurable resin film) on a surface of a base material and a release and moving step that releases the fine structure mold from the base material and moves the fine structure mold, wherein the fine structure mold includes at least a first mold depression pattern which is disposed at center area of it, and a second mold depression pattern which is disposed in at least one side part in circumference area of it, and a size of the second mold depression pattern is smaller than a size of the first mold depression pattern.

9 Claims, 20 Drawing Sheets

(56) References Cited

U.S. PATENT DOCUMENTS

2007/0176320 A1    8/2007    Nakamura et al.
2011/0018168 A1    1/2011    Wuister et al.

FOREIGN PATENT DOCUMENTS

| JP | 2010-264720 A | 11/2010 |
| JP | 211-29642 A | 2/2011 |

* cited by examiner

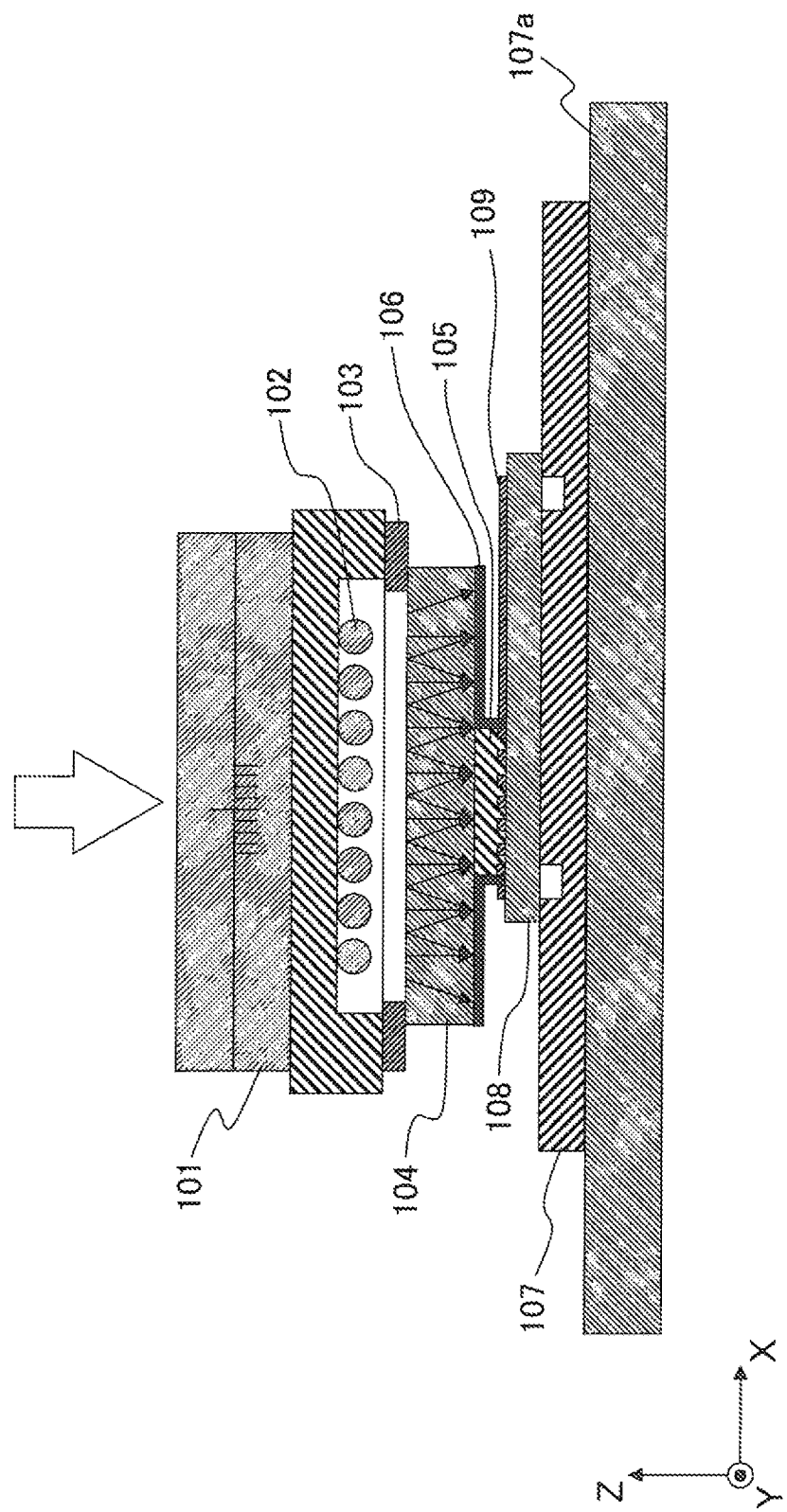

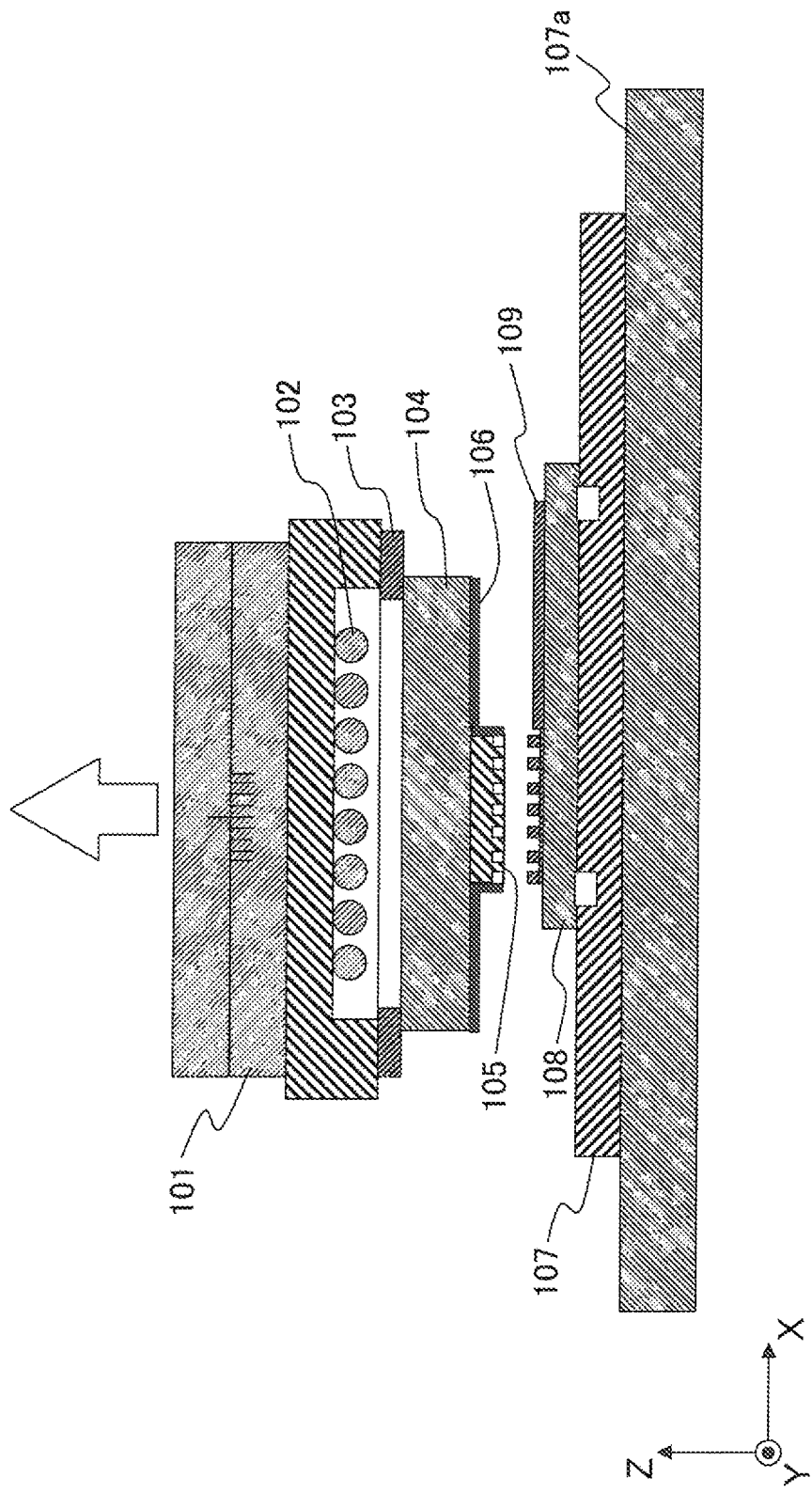

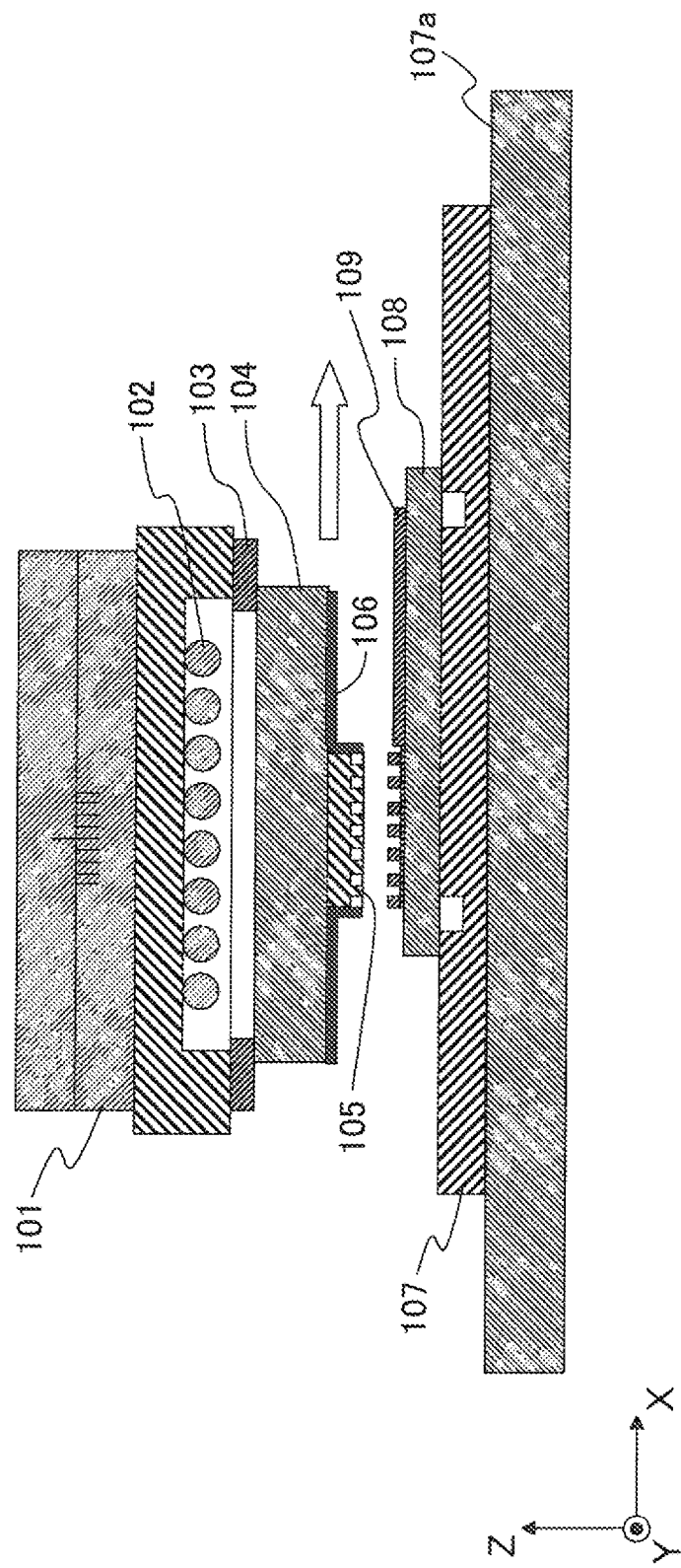

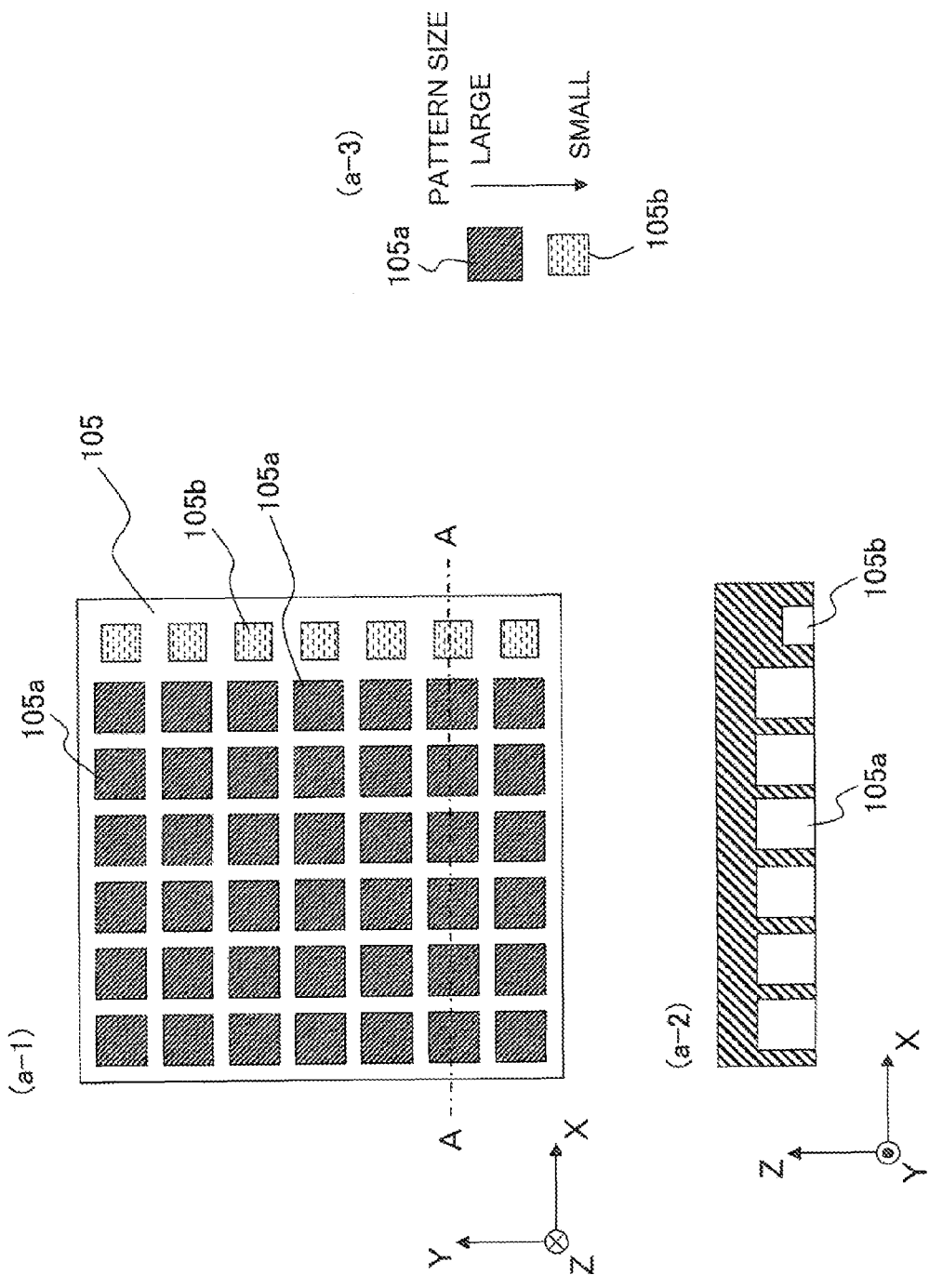

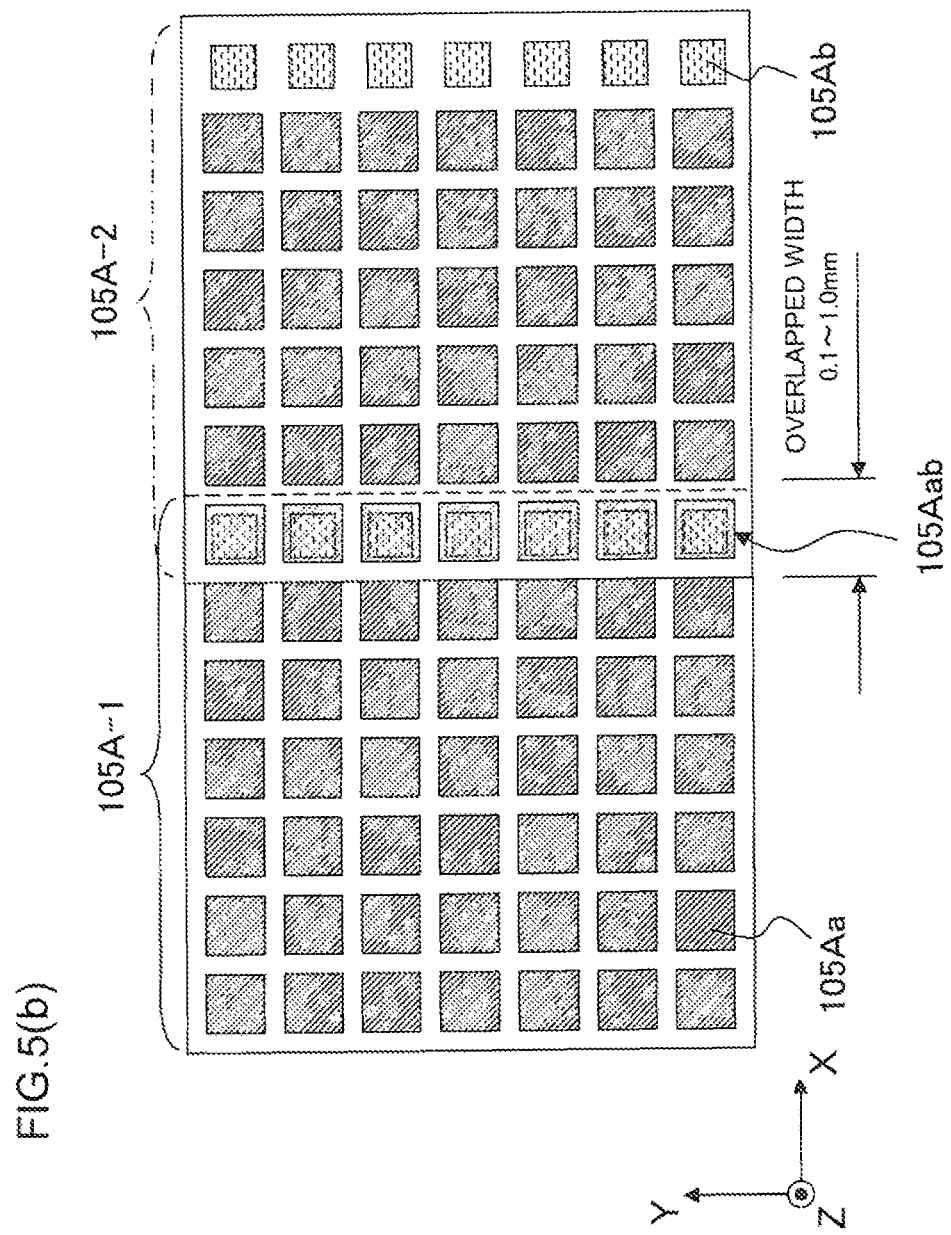

(Difference between height of first overlapping projection pattern 105Aab and height of the first projection pattern 105Aa)

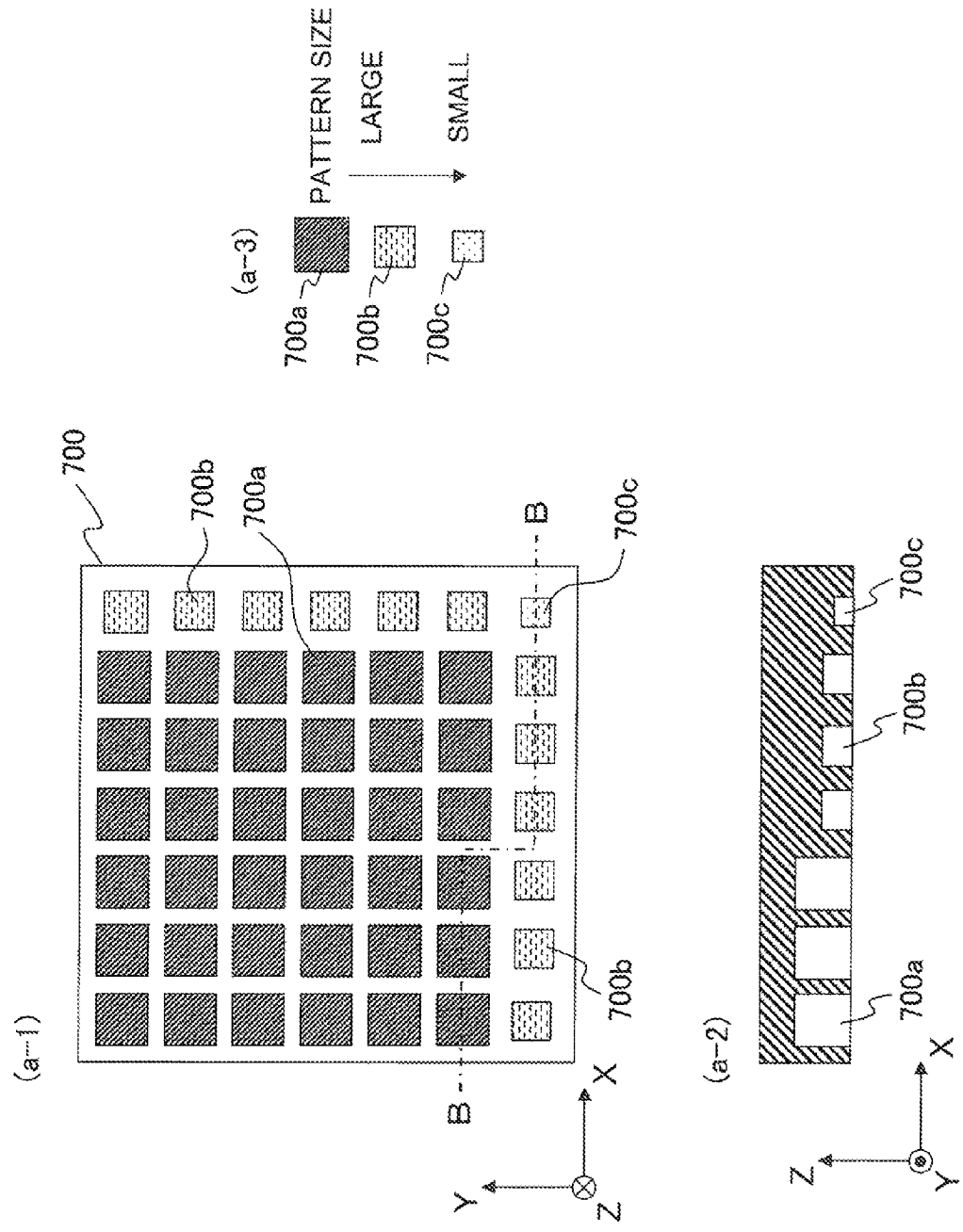

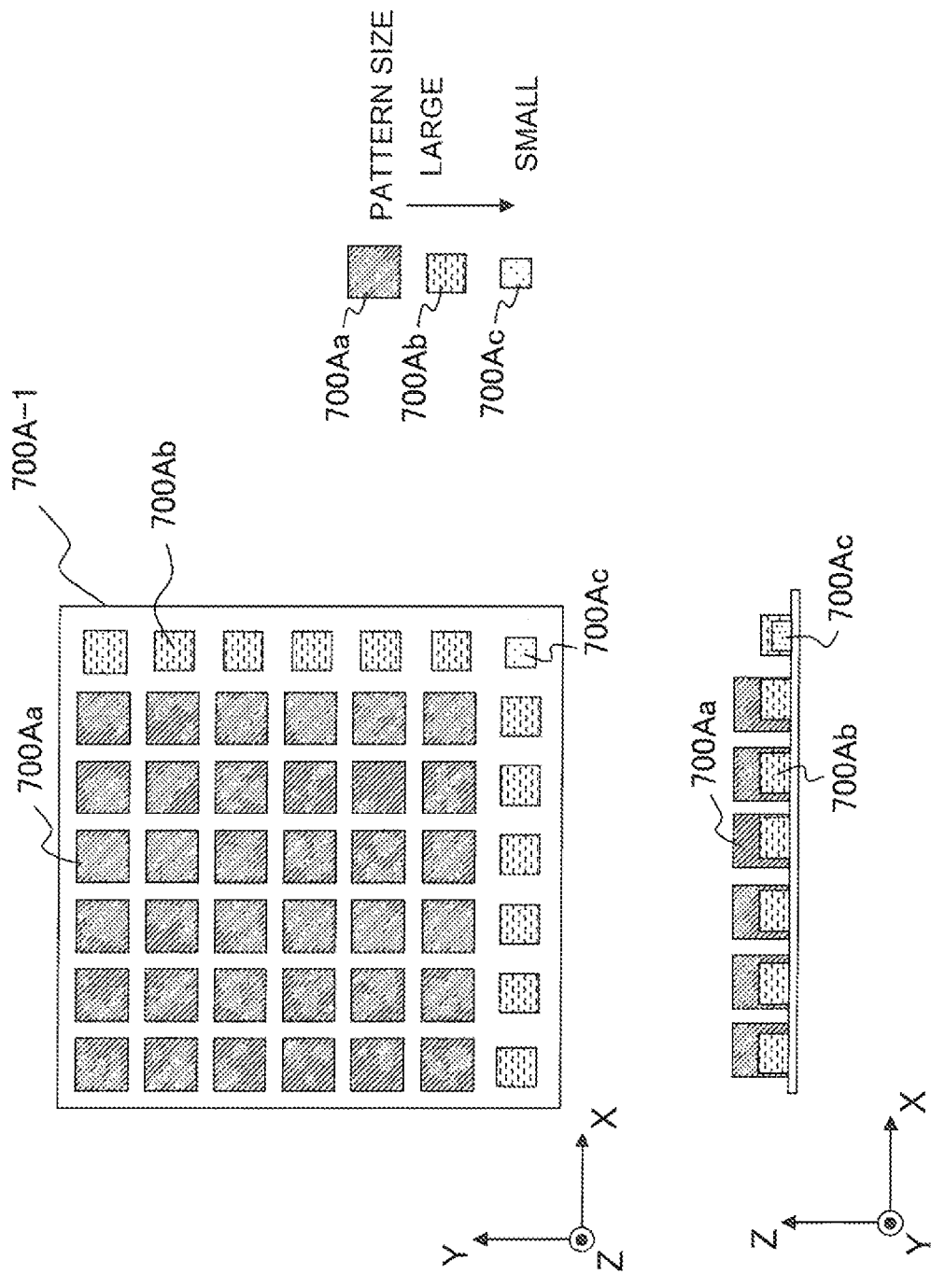

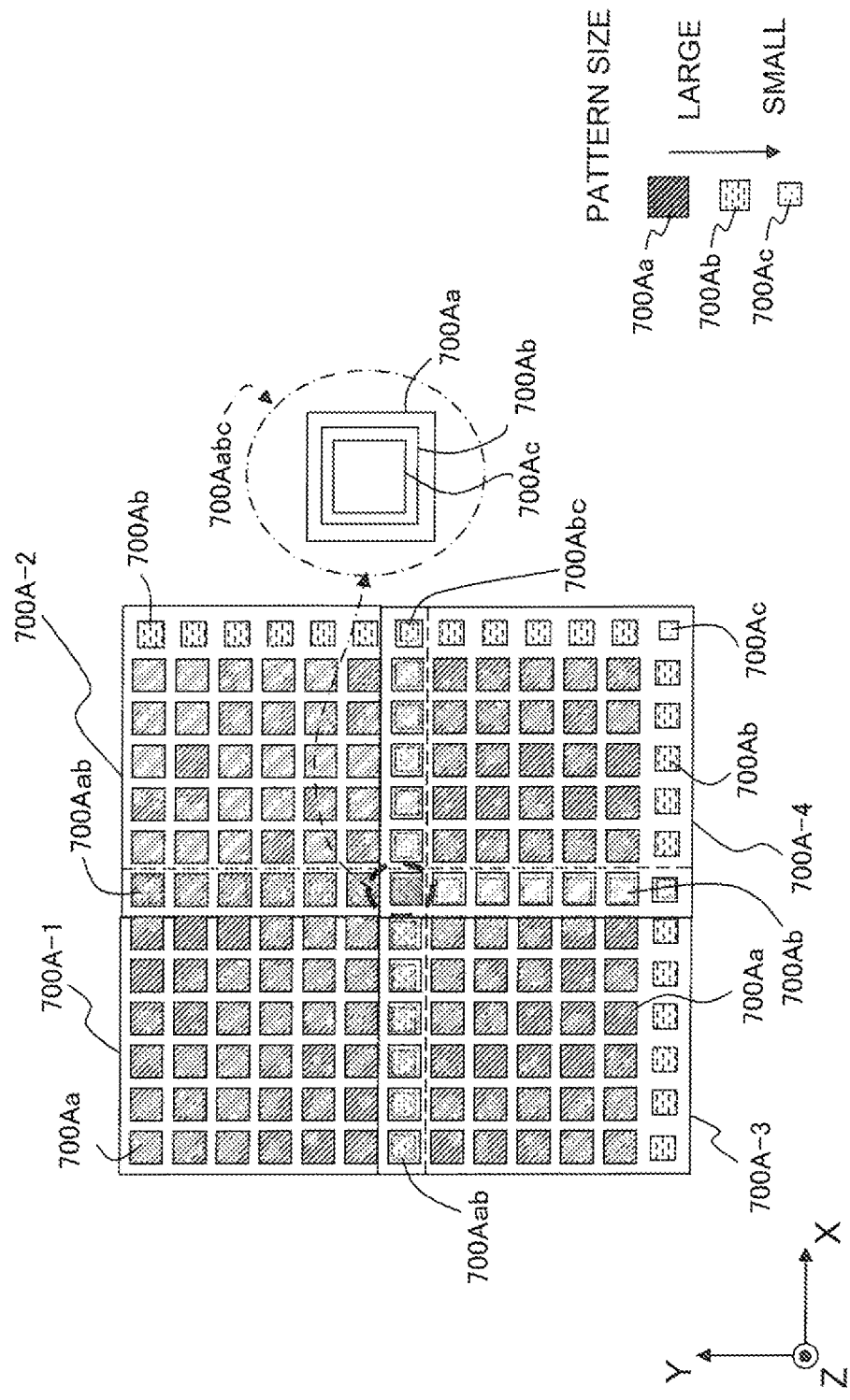

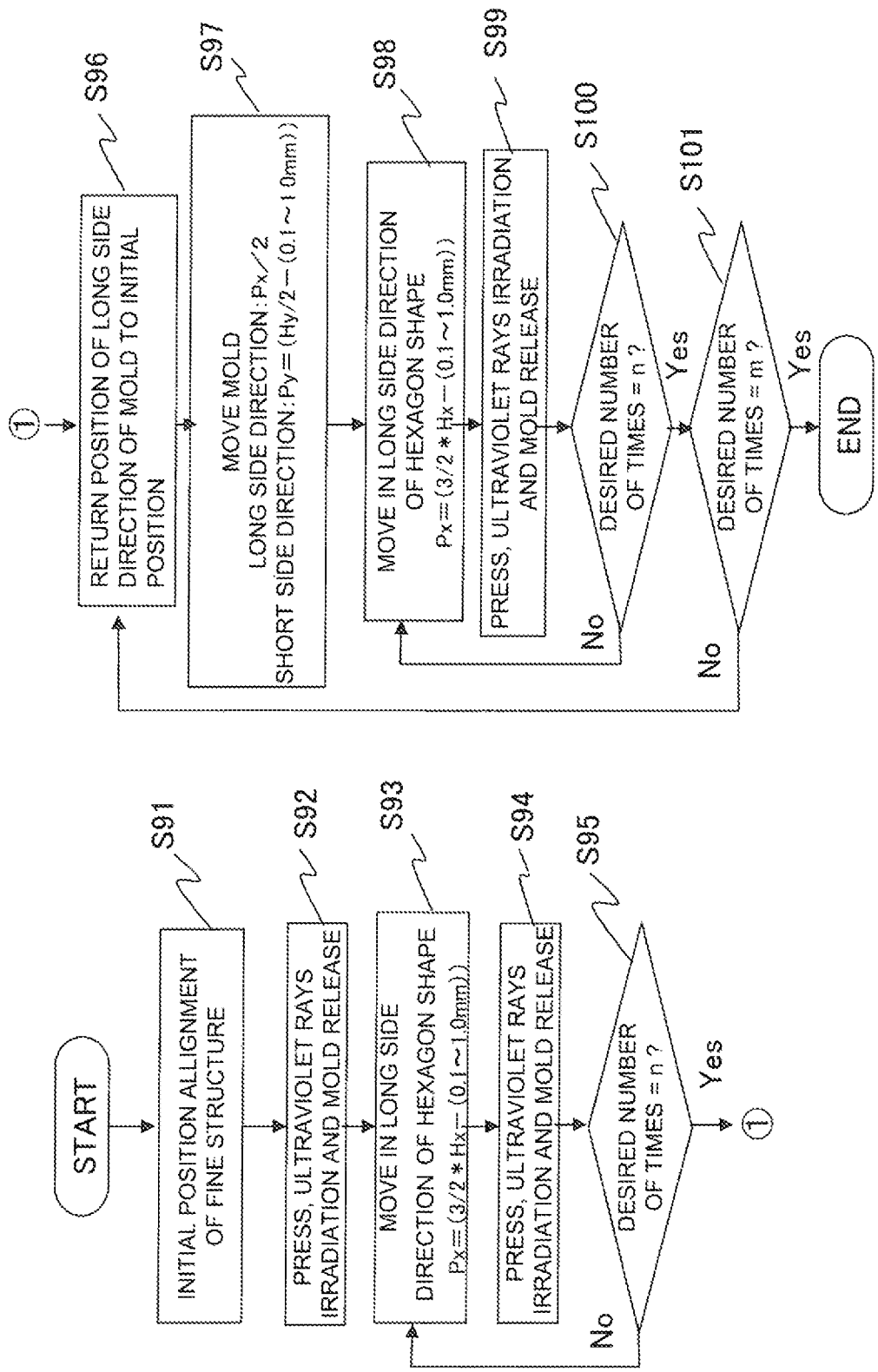

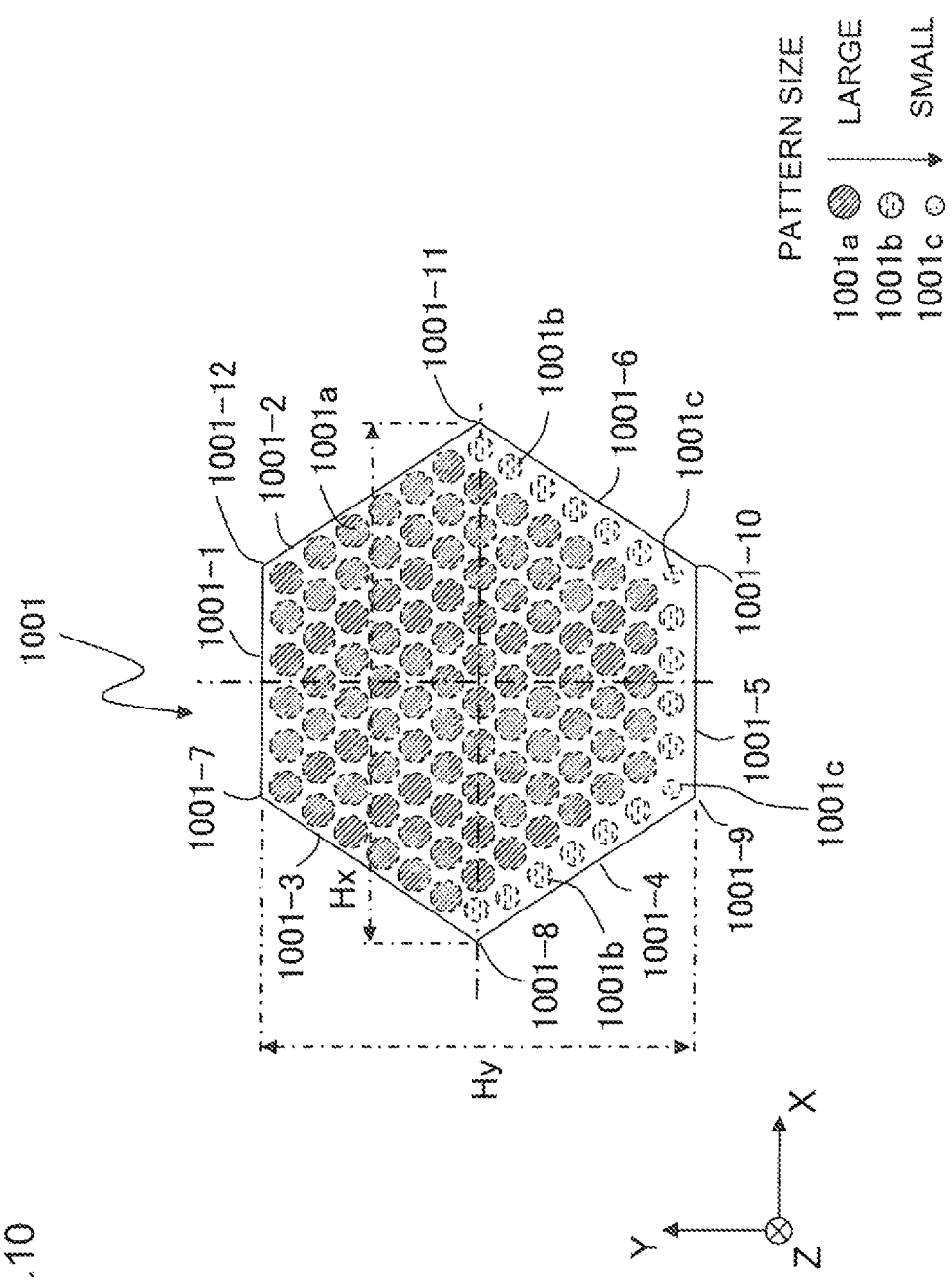

METHOD OF MANUFACTURING FINE STRUCTURE BODY AND FINE STRUCTURE MOLD

This application is a U.S. National Phase Application of PCT International Patent Application No. PCT/JP2012/002863, filed Apr. 26, 2012, claiming the benefit of priority of Japanese Patent Application No. 2011-125227, filed Jun. 3, 2011, all of which are incorporated by reference herein in their entirety.

TECHNICAL FIELD

The invention relates to a technology for manufacturing a fine structure body having an optical property.

BACKGROUND ART

Conventionally, the photolithography method generally used in a semiconductor manufacturing process has been applied to fine processing of a structure body having an optical property. In the photolithography method that is one of the pattern transfer technologies, due to the refinement of pattern, the processed dimensions are approaching the wavelength of the light source used for exposure. Therefore, the fine processing of the structure body using the photolithography method is reaching the technical limit.

Accordingly, in order to develop the refinement and high precision of pattern, the processing is performed by an electron beam lithography method using an electron beam lithography (EB lithography) system which is a kind of charged-particle radiation apparatus. However, although the refinement of pattern and the increase in the number of lithographs are attempted, the increasing size and highly precise control mechanism of the apparatus, for example, are then needed, leading to a fault of a higher production cost of the apparatus.

On the other hand, the technology for forming a fine unevenness pattern at a low cost is disclosed by U.S. Pat. Nos. 5,259,926 and 5,772,905. U.S. Pat. No. 5,259,926 discloses that a mold having a reversal unevenness pattern formed by reversing the unevenness pattern which is to be formed on a substrate is provided, and that the predetermined unevenness pattern is transferred by pressing the mold against a layer of a resist film which has been formed on a surface of the substrate. Further, by the nano-imprint technology described in U.S. Pat. No. 5,772,905, silicon wafer is provided as a mold, and it is possible to form a fine unevenness pattern, which has the size of 25 nm or less, on a layer of a resist film by pressing the mold for transferring the pattern.

Meanwhile, in recent years, area-enlargement and high-performance of optical components such as a liquid crystal display are desired. The structure in which a light guiding plate for adjusting the refractive index of light and a phase difference film are built is known as a structure of the liquid crystal display. It is required to realize a fine structure on which the fine unevenness pattern is transferred with respect to these light guiding plates and phase difference films and the like. To realize such a fine structure in a liquid crystal display, for example, an integral and seamless fine structure body which has a large area is necessary.

However, since it is difficult to manufacture an integral fine structure body which has a large area, a fine structure body with a little influence of the seam has been manufactured by, for example, plural basic fine structure bodies, which are individual pieces disposed side by side on a base material (for example, see Japanese laid-Open Patent Application No. 2010-80670).

In Japanese Laid-Open Patent Application No. 2010-80670, as shown in FIG. 15, basic fine structure bodies 1502 having undercut ends are disposed on a base material 1503 side by side and are bonded together through an adhesion layer 1504. A plurality of the basic fine structure bodies 1502, as shown in FIG. 15, are disposed side by side with a gap 1506 on the base material 1503 and are bonded thereon via multiple surfaces to construct a fine structure body 1501. An unevenness pattern 1505 is transferred on the fine structure body 1501, which is a body subjected to transferring, by pressing a mold against the fine structure body 1501 constructed in this manner.

SUMMARY OF THE INVENTION

However, in the method of manufacturing a fine structure body disclosed by Japanese Laid-Open Patent Application No. 2010-80670, there is a problem that the influence of the seam remains because it is only possible to manufacture fine structure body with gaps in between.

In view of the problem of the conventional method of manufacturing a fine structure body, an object of the present invention is to provide a method of manufacturing a fine structure body with a little influence of the seam, and a fine structure mold.

To solve the above described problem, a method of manufacturing a fine structure body of the present invention is a method of manufacturing the fine structure body which manufactures the fine structure body by repeating (i) a basic fine structure body forming step that forms a basic fine structure body by pressing a fine structure mold against a curable resin on a surface of a base material and (ii) a release and moving step that releases the fine structure mold from the base material and moves the fine structure mold, and is characterized in that the fine structure mold includes at least a first mold depression pattern which is disposed at center area of it, and a second mold depression pattern which is disposed in at least one side part in circumference area of it, and a size of the second mold depression pattern is smaller than a size of the first mold depression pattern.

To solve the above described problem, a fine structure mold of the present invention is a fine structure mold which is pressed against a curable resin on a surface of a base material, to form a basic fine structure body on a surface of the base material, and is characterized in that the fine structure mold comprises a first mold depression pattern which is disposed at center area of it and a second mold depression pattern which is disposed in at least one side part in circumference of it, and a size of the second mold depression pattern is smaller than a size of the first mold depression pattern.

According to the present invention, it is possible to realize a fine structure body with a little influence of the seam and no discontinuity felt at the seam on a visual observation level, and a method of manufacturing the same.

BRIEF DESCRIPTION OF THE DRAWINGS

FIG. 3(b) is a sectional view showing an operation for pressing the fine structure mold and irradiating ultraviolet rays according to an operation in the first embodiment of the present invention;

FIG. 3(c) is a sectional view showing an operation for releasing the fine structure mold from a base material according to an operation in the first embodiment of the present invention;

FIG. 3(d) is a sectional view showing an operation for moving the fine structure mold to a next position according to an operation in the first embodiment of the present invention;

FIG. 5(a) is a schematic view showing a fine structure mold at the time of the overlapping in one direction according to the first embodiment of the present invention;

FIG. 5(b) is a schematic view showing a fine structure body at the time when the first forming step is overlapped with the second forming step according to the first embodiment of the present invention;

FIG. 7(a) is a schematic view showing a fine structure mold at the time of the overlapping in two directions according to the second embodiment of the present invention;

FIG. 7(b) is a schematic view showing a fine structure body which is formed in the first forming step according to the second embodiment of the present invention;

FIG. 8 is a schematic view and a partial enlarged view showing a fine structure body in the case where the first forming step, the second forming step, the third forming step and the fourth forming step are overlapped according to the second embodiment of the present invention;

FIG. 9 is a flow chart showing a method for manufacturing the fine structure body according to a third embodiment of the present invention;

FIG. 10 is a schematic plan view showing a fine structure mold which is used in the third embodiment of the present invention;

DESCRIPTION OF EMBODIMENTS

Figure 1:
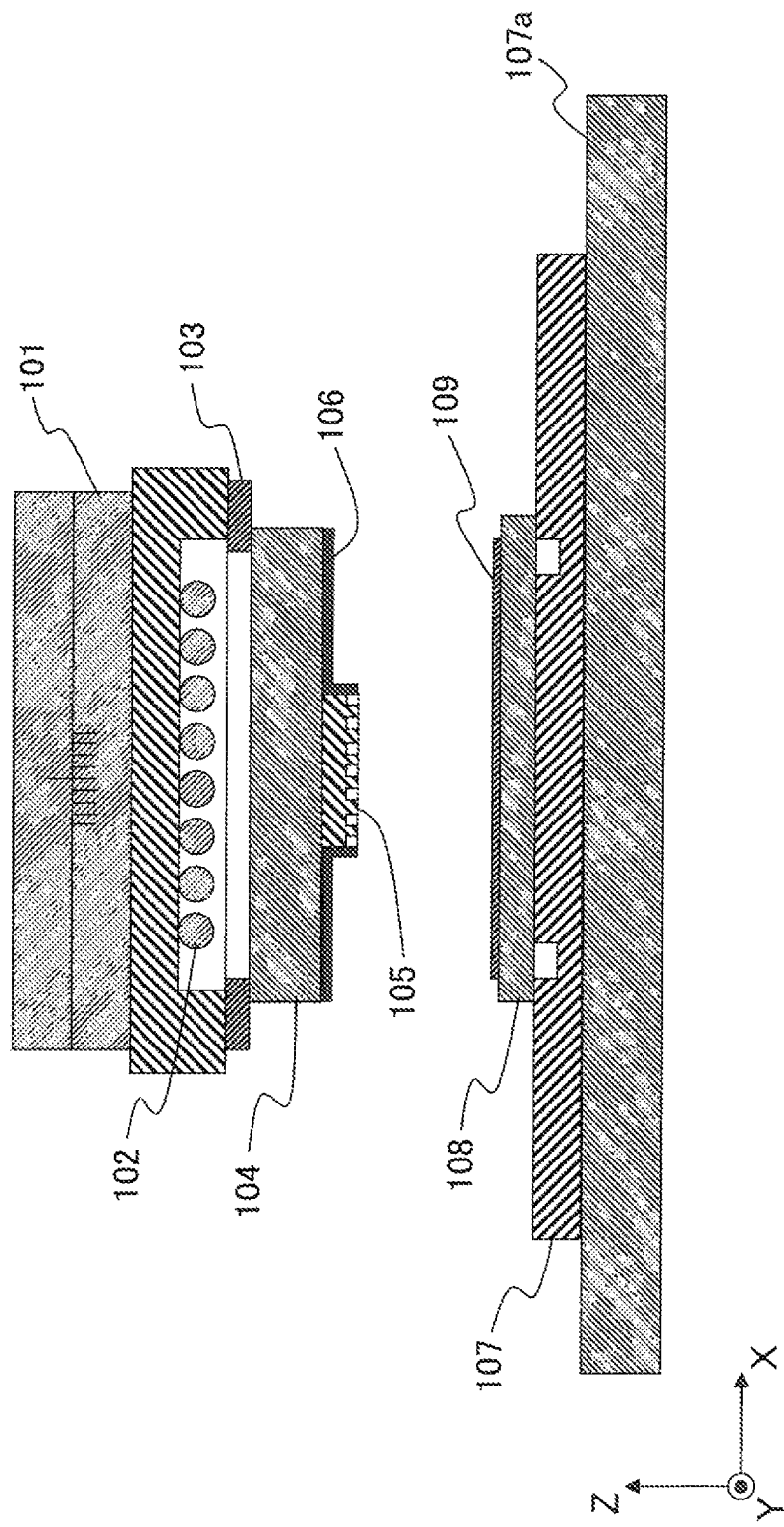
FIG. 1 is a sectional view showing a manufacturing apparatus of a fine structure body according to a first embodiment of the present invention.

The present invention is described below with reference to the drawings. In the description below, the same reference numerals are given to the same components, and some description is suitably omitted. In order to clarify the correspondence relations between respective drawings, the X-Y-Z axes are shown in the drawings.

(First Embodiment)

FIG. 1 is a schematic sectional view showing a manufacturing apparatus of a fine structure body in the first embodiment of the present invention. As shown in FIG. 1, an ultraviolet-rays light source 102 is disposed on a turn stage 101 on a stage (not shown) which moves up and down. A silica glass board 104 is attached on the ultraviolet-rays light source 102 through a gel-like cushion 103. A fine structure mold 105 which ultraviolet rays penetrate is attached to the silica glass board 104 through a transparent double-stick tape (not shown). As shown in FIG. 1, a shade film 106 is formed in the region, which is on a surface of the silica glass board 104 facing a base material 108, except the portion to which the fine structure mold 105 is attached. The material of the shade film 106 is, for example, Al (aluminum) or Cr (chromium), and the thickness is about 100 nm. The shade film 106 is formed by metallic film sputtering or metal deposition. This fine structure mold 105 is a mold corresponding to the overlapping in one direction.

At the position facing the fine structure mold 105, the base material 108 is fixed on a two-dimensionally movable plain stage 107a through a jig for fixing a base material 107. A photocurable resin film 109 in an uncured state (uncured photocurable resin 401) is applied to the surface of the base material 108 that is fixed.

In the present invention, the fine structure body manufactured from the base material 108 is, for example, a light guiding sheet or phase difference film of the liquid crystal display, or a film for exterior fabrication of surface texturing.

Figure 2:
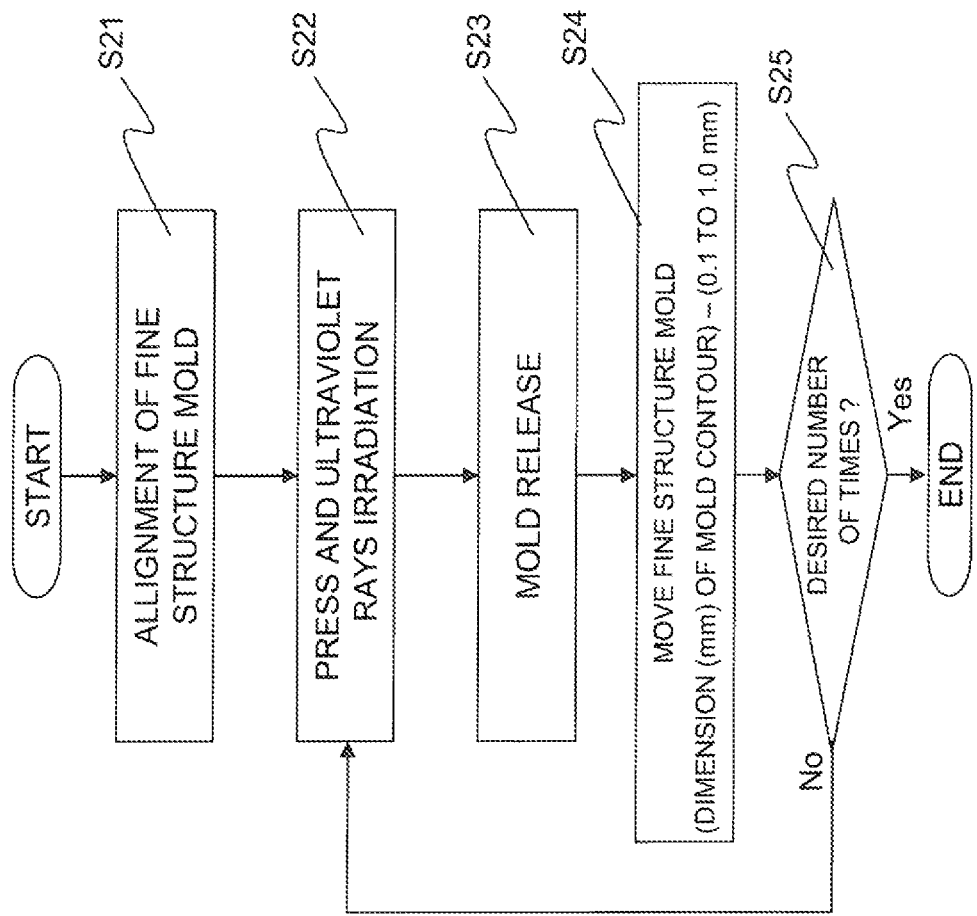
FIG. 2 is a flow chart showing a method for manufacturing the fine structure body according to the first embodiment of the present invention.

A flow chart of FIG. 2 shows a method of manufacturing the fine structure body of the present embodiment 1, in which a forming apparatus for the fine structure body having such a structure is utilized. A basic flow of a handling process is described below with reference to the flow chart of FIG. 2 and FIG. 3(a) to FIG. 3(d), which are the drawings that show respective states in the operation of the first embodiment of the present invention.

Figure 3A:
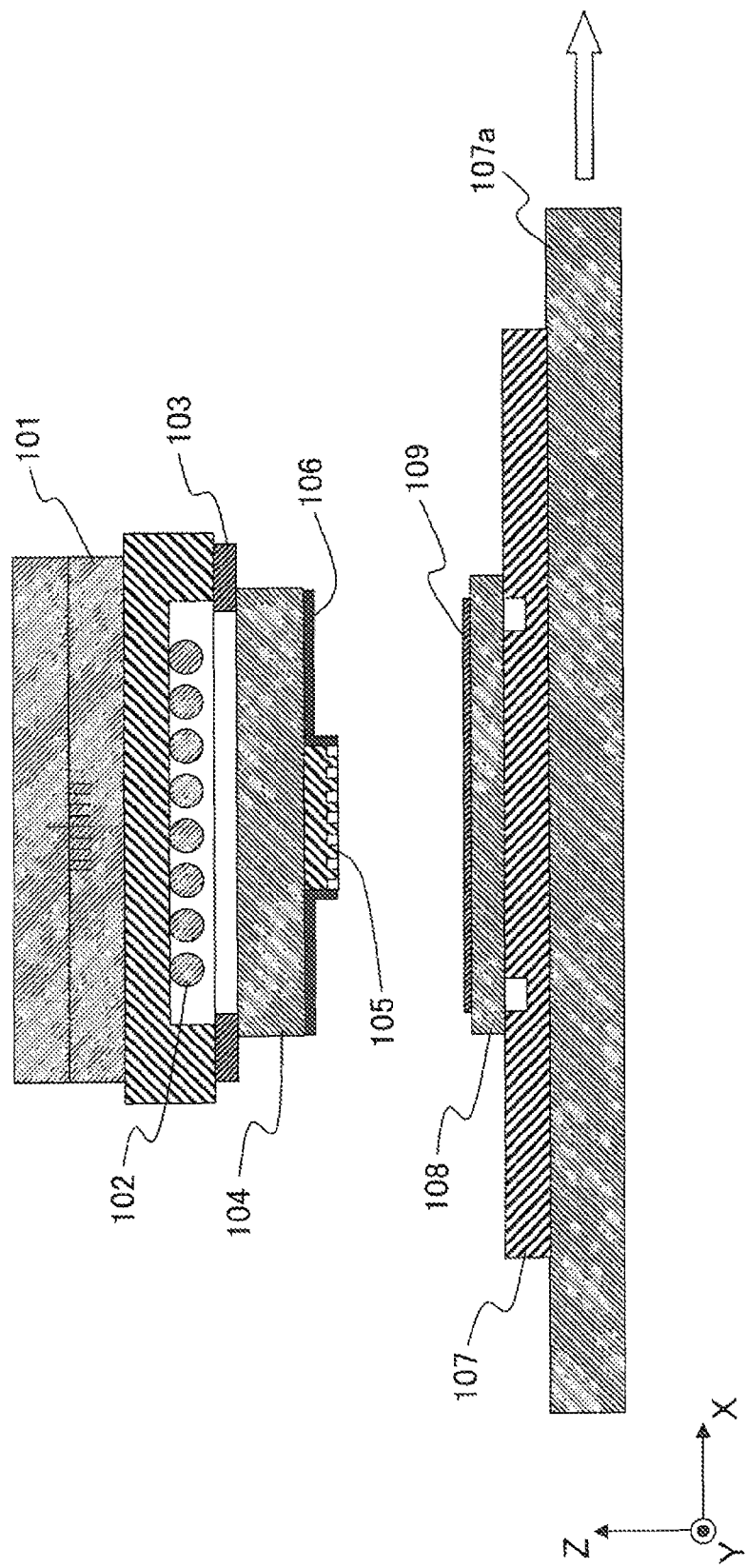
FIG. 3(a) is a sectional view showing an operation for alignment of a fine structure mold according to an operation in the first embodiment of the present invention.

(1) First, as shown in FIG. 3(a), each component is disposed at the initial position for forming by moving the base material 108 on the plain stage 107a, in the state in which the output of the ultraviolet-rays light source 102 is turned OFF (Step S21).

(2) Subsequently, as shown in FIG. 3(b), the fine structure mold 105 is pressed on the photocurable resin film 109 in the uncured state and, thereafter, the output of the ultraviolet-rays light source 102 is turned ON to irradiate the ultraviolet rays from the ultraviolet-rays light source 102, which have penetrated the fine structure mold 105, on the photocurable resin film 109 in the uncured state (Step S22). The details of the pressing method of the fine structure mold 105 will be described later.

Here, Step S22 is one example of a basic fine structure body forming step.

(3) Subsequently, the output of the ultraviolet-rays light source 102 is turned OFF after the time required for exposure of the photocurable resin film 109 in the uncured state passes. Then, as shown in FIG. 3(c), the fine structure mold 105 is released from the photocurable resin film 109 (Step S23). The first forming step is completed by Step S22 and Step S23 for the first time.

(4) Subsequently, as shown in FIG. 3(d), the base material 108 and the fine structure mold 105 are relatively moved to the position at which the forming portion, which has been formed in Step S22 to Step S23, overlaps with a part of the fine structure mold 105 (Step S24). Here, it is desirable that the width of a region, on which the forming portion that has been formed in Step S22 to Step S23 overlaps with the fine structure mold 105, be set to 0.1 mm or more and 1.0 mm or less. At this time, in order to set the width of the region, on which the forming portion that has been formed in Step S22 to Step S23 overlaps with the fine structure mold 105, to 0.1 mm or more and 1.0 mm or less, the amount of the relative movement of the fine structure mold 105 is set to "(dimension (mm) of the mold contour of the fine structure mold 105)—(0.1 to 1.0 mm)". That is, the amount of the relative movement of the fine structure mold 105 is a distance smaller by 0.1 mm or more and 1.0 mm or less than the dimension of the contour of the fine structure mold 105.

Here, Step S23 and Step S24 is one example of a release and moving step.

(5) It is judged whether the above described items (2) to (4) have been carried out a predetermined and desired number of times (Step S25). Here, in the case where they have not been carried out the desired number of times (NO of Step S25), the step returns to Step S22 to repeat the above described items (2) to (4) until they are carried out the desired number of times (YES of Step S25). That is, the first forming step, the second forming step, the third forming step and the like are carried out until the desired number of times is achieved.

A mold in which a fine reversal unevenness pattern (for example, line-and-space or hole shape) has been formed on a transparent material (for example, quartz glass or $SiO_2$ film) is used as the fine structure mold 105 in the first embodiment. This fine structure mold 105 has been formed by, for example, processing a transparent material with the outer diameter of 8 inches (20.3 cm) and the thickness of 0.525 mm, and producing a small piece mold cut out in a quadrangular shape such that the sides facing each other are parallel. After washing with a piranha solution, mold release processing is performed on this fine structure mold 105. Novec EGC-1720 (registered trademark) manufactured by Sumitomo 3M Limited is used as a mold release agent.

The shade film 106 is formed also on a surface of the side face portions of the fine structure mold 105 as well as on a surface of the silica glass board 104. The material of the shade film 106 is, for example, Al (aluminum) or Cr (chromium), and the thickness is about 100 nm. The shade film 106 is formed by metallic film sputtering or metal deposition. When the fine structure mold 105 is pressed, a part of the photocurable resin film 109 which has seeped out to the outer periphery is now not exposed to the ultraviolet rays due to the shade film 106, and a range in which the photocurable resin film 109 is hardened can be controlled. By means of this, a cured projection portion is not formed at the outer peripheral portion of the basic fine structure body formed by the fine structure mold 105. Therefore, it becomes possible to make the basic fine structure body formed by the first forming step and the basic fine structure body formed by the second forming step overlap each other precisely, as will be described later. Similarly, also in the process carried out thereafter, it becomes possible to make the overlapping concerning the second forming step and the third forming step, the overlapping concerning the third forming step and the fourth forming step, and the like be performed precisely.

A liquid radical polymerization monomer composition is used as the material of the photocurable resin film 109. As shown in FIG. 1, a resin layer of the photocurable resin film 109 is formed on the surface of the base material 108. It is desirable that the application quantity of the photocurable resin film 109 per surface of the fine structure mold 105 be set slightly more than the volume of the depressed shape of the fine structure mold 105 in order to form an uncured portion. Specifically, a quantity about 1.1 times as much as the required resin application quantity is desirable. Here, the reason why the uncured portion is made to be formed is, for example, to prevent air entrainment to the photocurable resin film 109.

Figure 4:
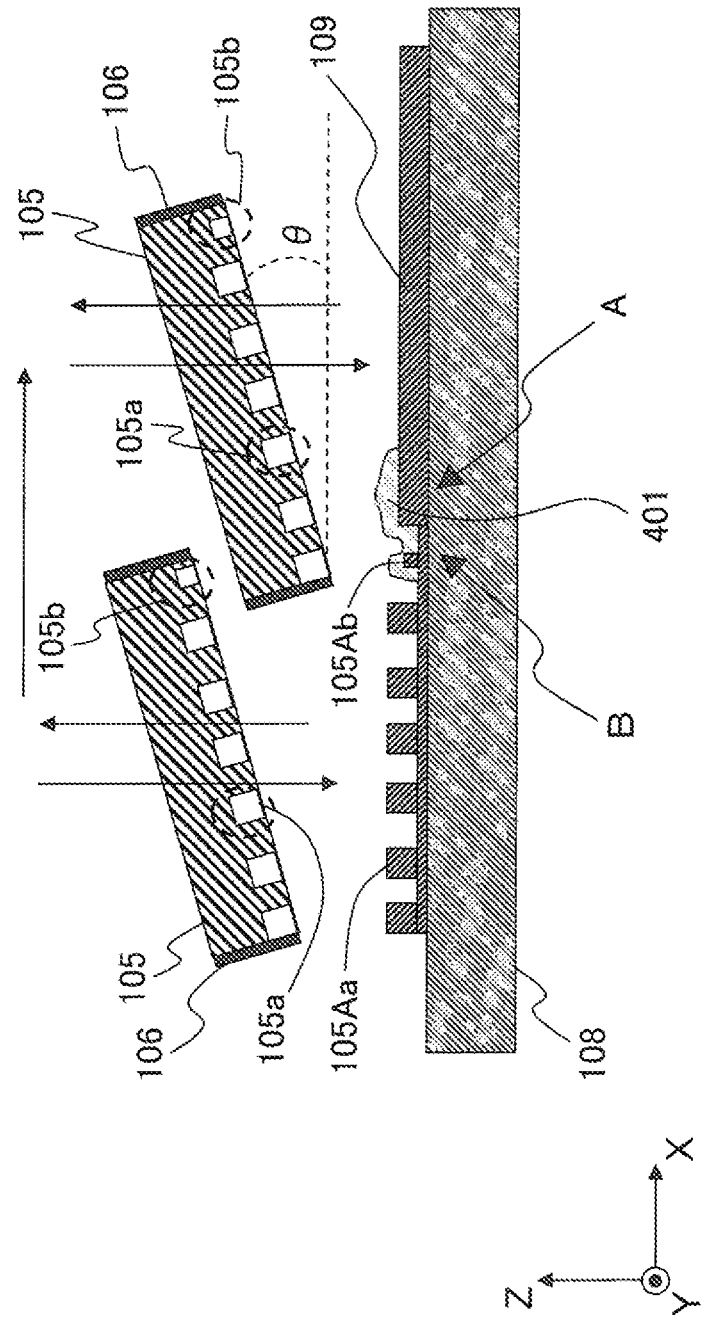
FIG. 4 is a schematic view showing a control with respect to an outflow direction of an uncured resin depending on relation between overlapping a first forming step with a second forming step and inclination of a mold according to the first embodiment of the present invention.

As shown in FIG. 4, the fine structure mold 105 is provided with inclination so that, regarding its undersurface, an upward inclination by the angle θ of 0.1 degrees or more and 5.0 degrees or less toward the next forming step side (the right side of FIG. 4) is formed. In the present first embodiment, due to the inclination by the angle θ, it is possible to make a part of the uncured photocurable resin 401 generated in the first forming step (the left side of FIG. 4) flow to the region A side of the second forming step (the right side of FIG. 4) to be carried out. When the fine structure mold 105 is released in the first forming step, a part of the uncured photocurable resin 401 returns to the region B side formed in the first forming step, and flows into the surroundings of a second projection pattern 105Ab of the basic fine structure body described later. Here, the reason why the upward inclination of the fine structure mold 105 is provided toward the next forming step side is to extrude the uncured photocurable resin 401 in order to prevent the uncured photocurable resin 401 from flowing into the surroundings of the second projection pattern 105Ab of the basic fine structure body too much. If the uncured photocurable resin 401 flows thereinto too much, an uncured photocurable resin film 109 is generated in the region B where the forming has been completed already, and a problem arises. Even if the extrusion quantity of the uncured photocurable resin 401 is large and the quantity of the uncured photocurable resin 401 which flows into the surroundings of the second projection pattern 105Ab of the basic fine structure body is too small, the required quantity of the resin is securable. As described later in detail, the reason why the required quantity of the resin is securable is that the uncured photocurable resin 401 flows into the surroundings of the second projection pattern 105Ab of the basic fine structure body due to a capillary phenomenon.

The fine structure mold 105 has a first mold depression pattern 105a and a second mold depression pattern 105b. In FIG. 4, the size of the second mold depression pattern 105b is smaller than the size of the other mold depression pattern of the fine structure mold 105. The first mold depression pattern 105a denotes a mold pattern of a regular size that is provided in the center area or the like of the fine structure mold 105. Here, the size of the first mold depression pattern 105a is equal to the size of the pattern that is to be formed finally, and the second mold depression pattern 105b exists in a region that is overlapped in another forming step.

The second projection pattern 105Ab denotes a projection pattern of the basic fine structure body formed by the second mold depression pattern 105b of a small size. The first projection pattern 105Aa denotes a projection pattern of the basic fine structure body formed by the first mold depression pattern 105a of a regular size.

As shown in FIG. 5(a), in the X-Y plane, the size of the first mold depression pattern 105a is larger than the size of the second mold depression pattern 105b. Similarly, the depth of the first mold depression pattern 105a is larger than the depth of the second mold depression pattern 105b. That is, in the fine structure mold 105, the size of the second mold depression pattern 105b which exists at the one side part is smaller than the size of the first mold depression pattern 105a which exists at the center area.

The air, which intrudes easily between the fine structure mold 105 and the base material 108 during the pressing, can be extruded simultaneously with the uncured photocurable resin 401 by further extruding the uncured photocurable resin 401, which has flowed to the region A, in the second forming step. In the present first embodiment, the fine structure mold 105 is inclined and, as described before, a part of the uncured photocurable resin 401 which is uncured in the second forming step also flows back into the region B, which is formed in the first forming step, due to a capillary phenomenon.

The application of the photocurable resin film 109 can be carried out by, for example, an inkjet method, a spin coating method, a spray coating method, a bar coating method and the like.

Next, the first forming step and the second forming step that have been described above are described in detail anew.

First, in Step S22 for the first time of the present first embodiment, as shown in FIG. 5(b), a basic fine structure body 105A-1 by the first forming step is formed by using the fine structure mold 105 shown in FIG. 5(a). Subsequently, in Step S24 for the first time, as shown in FIG. 5(b), the fine structure mold 105 is moved so that the second projection pattern 105Ab in the first forming step and the one side part of the first projection pattern 105Aa in the second forming step are overlapped with a width of 0.1 to 1.0 mm. Subsequently, in Step S22 for the second time, a basic fine structure body 105A-2 by the second forming step is formed while the fine structure mold 105 is overlapped with a width of 0.1 to 1.0 mm as shown in FIG. 5(b).

In FIG. 5(a), a drawing (a-1) at the upper portion denotes a plan view of this mold, and a drawing (a-2) at the lower portion denotes an A-A sectional view of the drawing (a-1) at the upper portion. A drawing (a-3) shows large and small sizes of the patterns. In the X-Y plane, the size of the first mold depression pattern 105a is larger than the size of the second mold depression pattern 105b.

In FIG. 5(b), the basic fine structure body 105A-1 by the first forming step denotes the basic fine structure body formed by the first forming step, and the basic fine structure body 105A-2 by the second forming step denotes the basic fine structure body formed by the second forming step. Further, a first overlapping projection pattern 105Aab denotes a projection pattern of the basic fine structure body formed through overlapping by the first forming step and the second forming step.

Here, regarding the shape of each mold depression pattern of the fine structure mold 105, it is desirable that the size of the second mold depression pattern 105b (existing in the overlapping region) be set to 50% or more and 75% or less of the size of the first mold depression pattern 105a which exists in the other region (corresponding to the size of the projection portion desired finally) in the X-Y plane. Here, the size of each mold depression pattern denotes the depth and width of the mold depression pattern 105a or 105b. For example, in the case where each of the mold depression patterns 105a and 105b is a rectangular parallelepiped shape, it is desirable that the longitudinal/lateral length and height of the second mold depression pattern 105b be set to 50% or more and 75% or less of the longitudinal/lateral length and height of the first mold depression pattern 105a respectively. By such a relation, it is possible to make a level difference small, which is occurred between the height of the first overlapping projection pattern 105Aab of the basic fine structure body that is formed in the region in which the mold depression patterns 105a and 105b are overlapped and the height of the first projection pattern 105Aa of the basic fine structure body that is formed in the other region in which the patterns are not overlapped.

Here, the reason why the size of the second mold depression pattern 105b is set to 50% or more and 75% or less of the size of the first mold depression pattern 105a is that the size of the second mold depression pattern 105b, which exists in the region where the mold depression patterns 105a and 105b are overlapped, is made smaller than the size of the first mold depression pattern 105a which exists in the other region. Also in the third forming step, the fourth forming step, and the like, since the fine structure mold 105 is used similarly, the size of the pattern in the overlapping region is the same as the relation between the first forming step and the second forming step. That is, the relation between the third forming step and the fourth forming step is the same as the relation between the first forming step and the second forming step, and the relation between the fourth forming step and the fifth forming step is the same as the relation between the first forming step and the second forming step. In the present first embodiment, it is possible to allow a plurality of the basic fine structure body to be disposed side by side and connected in high accuracy by using such a fine structure mold 105.

Figure 6:
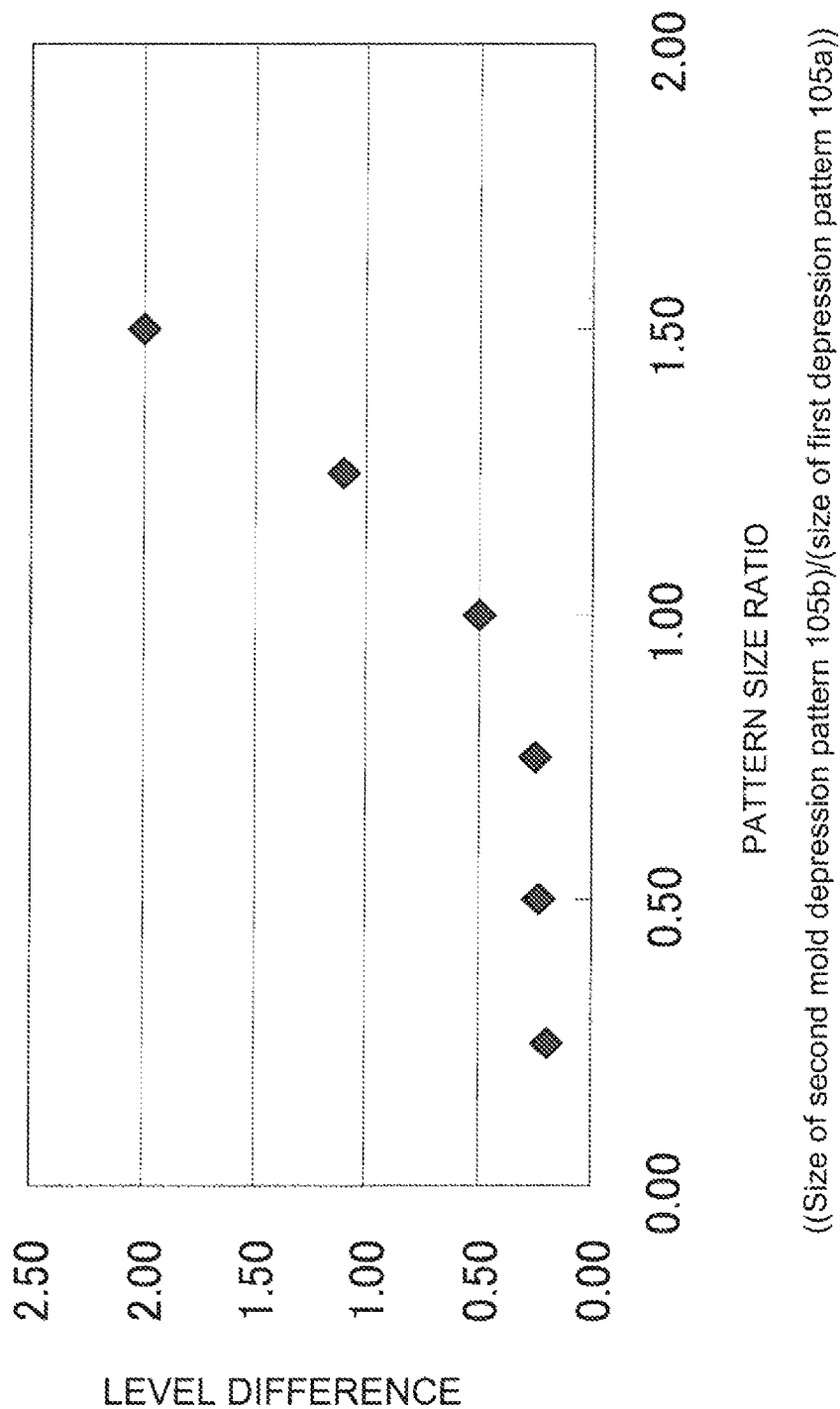
FIG. 6 is a graph showing experiment measured values with respect to a level difference of projection patterns of the basic fine structure body which are generated by overlapping the first forming step with the second forming step, and a pattern size ratio of the depression of the mold according to the first embodiment of the present invention.

FIG. 6 is a graph showing the relation between the pattern size ratio (the ratio between the size of the first mold depression pattern 105a and the size of the second mold depression pattern 105b) and the level difference (the difference between the height of the first overlapping projection pattern 105Aab and the height of the first projection pattern 105Aa).

In FIG. 6, the horizontal axis denotes the pattern size ratio. The pattern size ratio of the horizontal axis of FIG. 6 is the ratio ((the size of the second mold depression pattern 105b)/(the size of the first mold depression pattern 105a)) between the size of the second mold depression pattern 105b, which exists in the overlapping region described above, and the size of the first mold depression pattern 105a which exists in the other region.

In FIG. 6, the vertical axis shows the size of the level difference as the rate with the depth of the first mold depression pattern 105a being assumed to be 1. The level difference of the vertical axis of FIG. 6 denotes the difference between the height of the first overlapping projection pattern 105Aab of the basic fine structure body, which is formed in the overlapping region, and the height of the first projection pattern 105Aa of the basic fine structure body which is formed in the other region not for overlapping.

On the horizontal axis of the graph of FIG. 6, in a case where the pattern size ratio is over 1, the size of the second mold depression pattern 105b is larger than the size of the first mold depression pattern 105a. In this case, the first mold depression pattern 105a of the fine structure mold 105 is, during the second forming step, caught on the projection portion (the second projection pattern 105Ab) which has been formed by the first forming step, the pressing can not be carried out so that the second projection pattern 105Ab formed by the first forming step is covered, and the level difference becomes over 1 as shown in FIG. 6.

As shown in the graph of FIG. 6, even in a case where the fine structure mold 105 of the present first embodiment is used, a level difference that approximates ¼ of the depth of the first mold depression pattern 105a is generated. Therefore, when the pattern is designed practically, design in consideration of this level difference is necessary. However, since the level difference here is smaller than the conventional one due to using of the fine structure mold 105 of the present first embodiment, this level difference is merely a level difference that can be absorbed by pattern design.

According to a result of the experiment by the inventors, when the pattern size ratio described above is less than 50%, a projection portion can not be formed with accuracy. The reason is considered to be that the amount of the uncured photocurable resin 401 which flows onto the second projection pattern 105Ab of the region B cannot be covered sufficiently by a capillary phenomenon and a pattern collapse is caused. Therefore, it is desirable that the pattern size ratio described above be 50% or more.

In this manner, by sequentially forming the basic fine structure bodies 105A-1 to 105A-2 as shown in FIG. 5(*b*), the overlapping can be performed also on the X-Y plane. In this manner, by repeating the overlap transferring by using the fine structure mold 105 of the present first embodiment, it becomes possible to manufacture a seamless fine structure body having a large area with a little influence of the seam.

(Second Embodiment)

FIG. 7(*a*), FIG. 7(*b*) and FIG. 8 are drawings for describing an example using the fine structure mold 700 of the second embodiment of the present invention. This fine structure mold 700 is a mold corresponding to the overlapping in two directions. Since the present second embodiment is similar to the first embodiment except that it corresponds to the overlapping in two directions, some description is suitably omitted.

In FIG. 7(*a*), a drawing (a-1) at the upper portion denotes a plan view of this mold viewed from the side on which the depression pattern has been formed, and a drawing (a-2) at the lower portion denotes a B-B sectional view of the drawing (a-1) at the upper portion. A drawing (a-3) shows large and small sizes of the patterns. Here, 700*a* denotes a first mold depression pattern corresponding to the projection portion of the fine structure body, which is to be formed finally, 700*b* denotes a second mold depression pattern which is located at each of the right and lower side parts and exists in an overlapping region, and 700*c* denotes a third mold depression pattern which is located at the right lower corner and exists in a region for triple overlapping.

In the X-Y plane, the size of the first mold depression pattern 700*a* is larger than the size of the second mold depression pattern 700*b*. The size of the third mold depression pattern 700*c* is still smaller than the size of the second mold depression pattern 700*b*.

That is, in the fine structure mold 700, the size of the second mold depression pattern 700*b* which exists at the two side parts is smaller than the size of the first mold depression pattern 700*a* which exists at the center area, and is larger than the size of the mold depression pattern 700*c* which exists at the corner between these two side parts (the right lower corner).

In FIG. 7(*b*), a basic fine structure body 700A-1 by the first forming step denotes the basic fine structure body formed by the first forming step utilizing the mold shown in FIG. 7(*a*) described above. Here, a first projection pattern 700Aa denotes a projection pattern of the basic fine structure body formed by the first mold depression pattern 700*a* described above, a second projection pattern 700Ab denotes a projection pattern of the basic fine structure body formed by the second mold depression pattern 700*b* described above, and a third projection pattern 700Ac denotes a projection pattern of the basic fine structure body formed by the third mold depression pattern 700*c* described above.

FIG. 8 denotes a fine structure body obtained by repeating the first step to the fourth step in the case where the fine structure mold 700 shown in FIG. 7(*a*) is utilized. The basic fine structure body 700A-1 by the first forming step denotes the basic fine structure body formed by the first forming step, a basic fine structure body 700A-2 by a second forming step denotes the basic fine structure body formed by the second forming step, a basic fine structure body 700A-3 by a third forming step denotes the basic fine structure body formed by the third forming step, and a basic fine structure body 700A-4 by a fourth forming step denotes the basic fine structure body formed by the fourth forming step. Further, a first overlapping projection pattern 700Aab denotes any of the projection pattern of the basic fine structure body in a portion overlapped by the first forming step and the second forming step, the projection pattern of the basic fine structure body in a portion overlapped by the first forming step and the third forming step, and the projection pattern of the basic fine structure body in a portion overlapped by the second forming step and the fourth forming step. Further, as to the overlapping at the corner, a third overlapping projection pattern of the basic fine structure body overlapped by the first forming step to the fourth forming step is denoted by 700Aabc.

An enlarged view of the third overlapping projection pattern 700Aabc is shown within the alternate long and short dash line at the right side in FIG. 8. Within the alternate long and short dash line at the right side in FIG. 8, the third projection pattern 700Ac denotes the projection pattern of the basic fine structure body in a portion formed by the first forming step, the second projection pattern 700Ab denotes the projection pattern of the basic fine structure body in a portion overlapped thereon by the second forming step and the third forming step, and the first projection pattern 700Aa denotes the projection pattern of the basic fine structure body overlapped by the fourth forming step.

In this manner, by sequentially forming the basic fine structure bodies 700A-1 to 700A-4 as shown in FIG. 7(*b*), as shown in FIG. 8, the overlapping can be performed also in the X-Y plane. In this manner, by repeating the overlap transferring by using the fine structure mold 700 of the present second embodiment, it becomes possible to obtain a molded article having a still larger area with a little influence of the seam.

(Third Embodiment)

In the third embodiment of the present invention, by making the shape of the mold hexagonal, the overlapping portions are not allowed to be disposed on a straight line, so that they are hard to recognize by a visual observation. That is, it becomes possible to obtain a molded article with a still less influence of the seam due to a fine structure mold 1001 of the present third embodiment. The present third embodiment is described with reference to FIGS. 9 to 11 while some description is omitted since the embodiment is similar to the first embodiment described above except for the change of the shape of the mold and that of the flow accompanying it.

A structure in which a fine reversal unevenness pattern (for example, line-and-space or hole shape) has been formed on a transparent material (for example, quartz glass or $SiO_2$ film) is used as the fine structure mold 1001 in the present third embodiment. This fine structure mold 1001 has been formed by, for example, processing the material with the outer diameter of 8 inches (20.3 cm) and the thickness of 0.525 mm, and producing a small piece mold cut out in a hexagonal shape such that the sides facing each other are parallel. A mold of a hexagonal shape is particularly effective in the case where the pattern has a staggered arrangement of dots, as in the present third embodiment.

After washing with a piranha solution, mold release processing is performed on this fine structure mold 1001. The shade film 106 is formed on the side face portions of the fine structure mold 1001 by metallic film sputtering or metal deposition similarly to the first embodiment described above. The photocurable resin film 109 which has seeped out to the outer periphery of the mold is now not exposed to the ultraviolet rays due to the shade film 106, and a range in which the photocurable resin film 109 is hardened can be controlled similarly to the first embodiment. The material of the shade film 106 is, for example, Al (aluminum) or Cr (chromium), and the thickness is about 100 nm.

A liquid radical polymerization monomer composition is used for the photocurable resin film 109, and a resin layer is formed on the surface of the base material 108. As described before in the first embodiment, in order to prevent air entrainment, it is desirable that the application quantity of the photocurable resin film 109 per surface of the fine structure mold 1001 be set slightly more than the volume of the depressed shape of the fine structure mold 1001.

Also for the fine structure mold 1001 of the third embodiment, the inclination by the angle of 0.1 degrees or more and 5 degrees or less as shown in FIG. 4 is provided to make the uncured photocurable resin 401 generated in the first forming step flow to the region A in which the second forming step is carried out. The air, which intrudes easily between the fine structure mold 1001 and the base material 108 during the pressing, is extruded by further extruding the uncured photocurable resin 401, which has flowed to this region A, in the second forming step. The application of the photocurable resin film 109 is carried out by, for example, an inkjet method, a spin coating method, a spray coating method, and a bar coating method.

Figure 11:
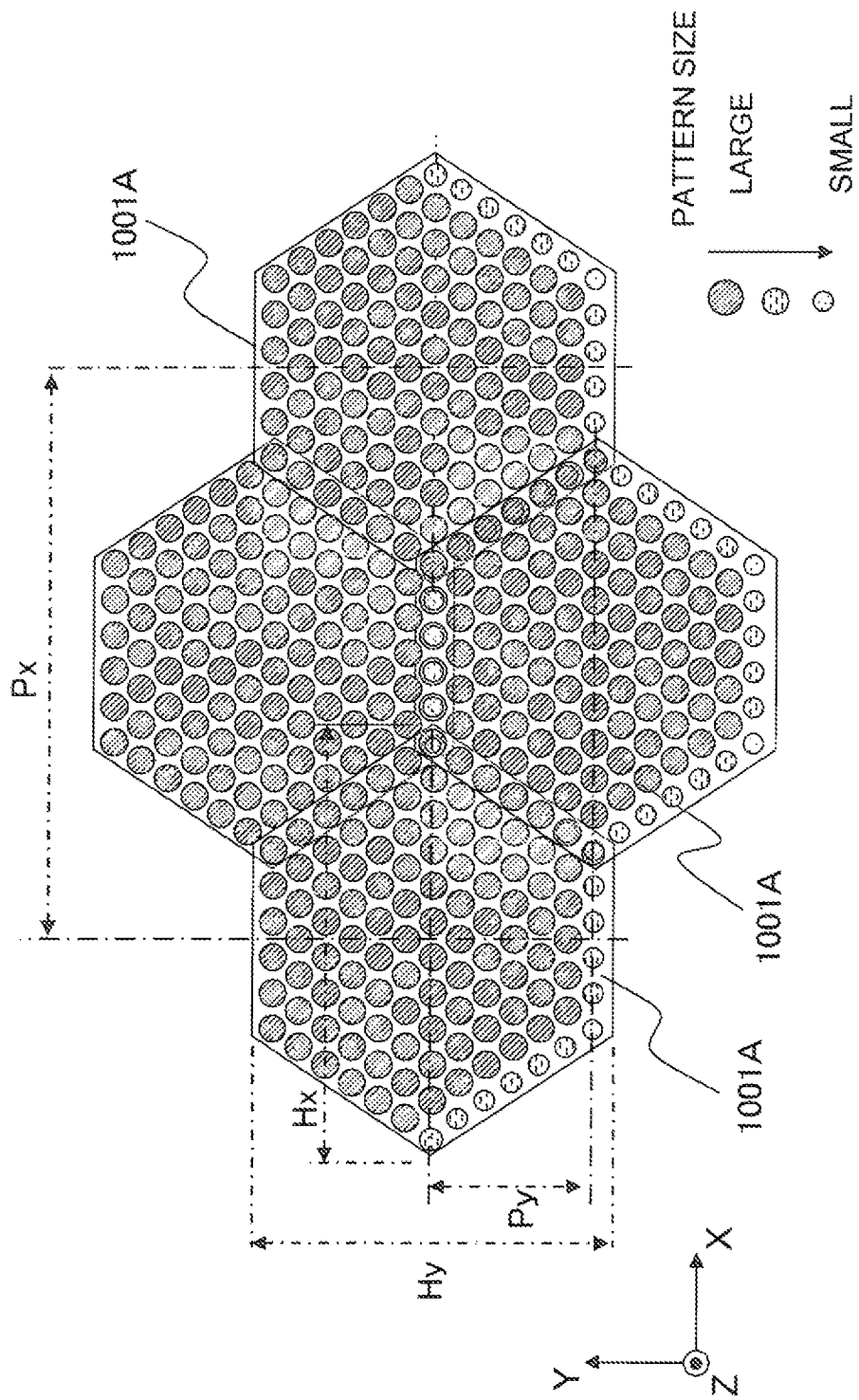
FIG. 11 is a schematic view showing a fine structure body in the case where two sides are overlapped by the first forming step, the second forming step, the third forming step, the fourth forming step, and the like on according to the third embodiment of the present invention.

A flow chart showing a method of manufacturing the fine structure body in the present third embodiment is shown in FIG. 9. FIG. 11, which denotes a fine structure body formed by the fine structure mold 1001, is used, for convenience, to describe the movement of the fine structure mold 1001 in the description below.

(1) First, the base material 108 is moved on the plain stage 107*a* so as to be located at the initial position for forming, in the state in which the output of the ultraviolet-rays light source 102 is turned OFF (Step S91).

(2) Subsequently, after the fine structure mold 1001 shown in FIG. 10 is pressed against the photocurable resin film 109 on the base material 108, the output of the ultraviolet-rays light source 102 is turned ON, the output of the ultraviolet-rays light source 102 is then turned OFF after the time required for exposure passes, and the fine structure mold 1001 is released (Step S92). By means of this, one basic fine structure body 1001A is formed.

(3) Subsequently, the fine structure mold 1001 that is a hexagon-shaped mold is moved, in the right side direction of FIG. 11, for the distance of Px=(3/2×Hx−(0.1 to 1.0 mm)) (Step S93). Here, Hx denotes the length of the lateral width of the hexagon.

(4) Subsequently, after the fine structure mold 1001 is again pressed against the photocurable resin film 109 on the base material 108, the output of the ultraviolet-rays light source 102 is turned ON, the output of the ultraviolet-rays light source 102 is then turned OFF after the time required for exposure passes, and the fine structure mold 1001 is released (Step S94).

(5) The above described items (3) to (4) are repeated n times (NO of Step S95, Steps S93 to S94) where n denotes a predetermined number. Here, in FIG. 11, n=3 for the predetermined number, that is, the pressing and releasing are repeated three times except for that at the initial position, and four basic fine structure bodies 1001A are formed.

(6) When the predetermined number n is achieved by repetition (YES of Step S95), the fine structure mold 1001 is returned to the initial position by moving the mold for the distance for which it has been moved in the direction of the long side of the hexagon-shaped mold (Step S96).

(7) Subsequently, the fine structure mold 1001 is moved, in the left side direction of FIG. 11, for the distance of a half of the above described Px, that is, for the distance of Px/2. Besides, it is moved downward, in the longitudinal direction of FIG. 11, for the distance of Py (=Hy/2−(0.1 to 1.0 mm)) (Step S97). Here, Hy denotes the longitudinal length of the hexagon.

(8) Subsequently, the fine structure mold 1001 is moved, in the right side direction of FIG. 11, for the distance of Px=(3/2×Hx−(0.1 to 1.0 mm)) (Step S98).

(9) Subsequently, after the fine structure mold 1001 is pressed against the photocurable resin film 109 on the base material 108, the output of the ultraviolet-rays light source 102 is turned ON, the output of the ultraviolet-rays light source 102 is then turned OFF after the time required for exposure passes, and the fine structure mold 1001 is released (Step S99).

(10) The above described items (8) to (9) are repeated a predetermined number of times (Step S100).

(11) The above described items (6) to (10) are repeated a predetermined number of times (Step S101).

Incidentally, when the above described items (6) to (10) are repeated, the step (7) may be carried out by a process of alternating the distances for moving in the left side direction of FIG. 11, for instance, in such a manner that the mold is moved for the distance of Px/2 in the left side direction of FIG. 11, and next the mold is moved for the distance of 3Px/2 in the left side direction of FIG. 11.

By repeating the above steps, it becomes possible to obtain a larger area for molding along with a still less influence of the seam compared with the first embodiment. Since the above described distances for moving are values that are to be calculated geometrically, specific numbers are omitted here.

In the case of forming by a lot of overlapping as shown in FIG. 11, the size of the second mold depression pattern 1001*b* which exists at the three side parts is allowed to be smaller than the size of the first mold depression pattern 1001*a* which exists at the center, and the size of the third mold depression pattern 1001*c* which exists at the left and right lower corners is allowed to be smaller than the size of the second mold depression pattern 1001*b*, as shown in FIG. 10.

In the present third embodiment, as shown in FIG. 10, the first mold depression patterns 1001*a* are the patterns which are formed at three upper side parts 1001-1, 1001-2 and 1001-3 on the fine structure mold 1001 having an external form of a hexagonal shape, at two corners 1001-7 and 1001-12, and at the center. The second mold depression patterns 1001*b* are the patterns which are formed at three side parts 1001-4, 1001-6 and 1001-5, and at two corners 1001-8 and 1001-11. The three side parts 1001-4, 1001-6 and 1001-5 exist on the adjoining three side parts on the outer periphery of the fine structure mold 1001. The size of the second mold depression pattern 1001*b* is set to 50% or more and 75% or less of the first mold depression pattern 1001*a*.

Further, the third mold depression patterns 1001*c* are the patterns which are formed at the two lower corners 1001-9 and 1001-10. The two lower corners 1001-9 and 1001-10 exist at the corners where the two side parts of the adjoining three side parts cross. The size of the third mold depression pattern 1001*c* is set to 50% or more and 75% or less of the second mold depression pattern 1001*b*.

By setting the sizes of the patterns in this manner, the overlapping can be performed also on the X-Y plane as shown in FIG. 11.

(Fourth Embodiment)

The fourth embodiment of the present invention is an embodiment in which the overlapping is performed against a roll-shaped base material.

Figure 12:
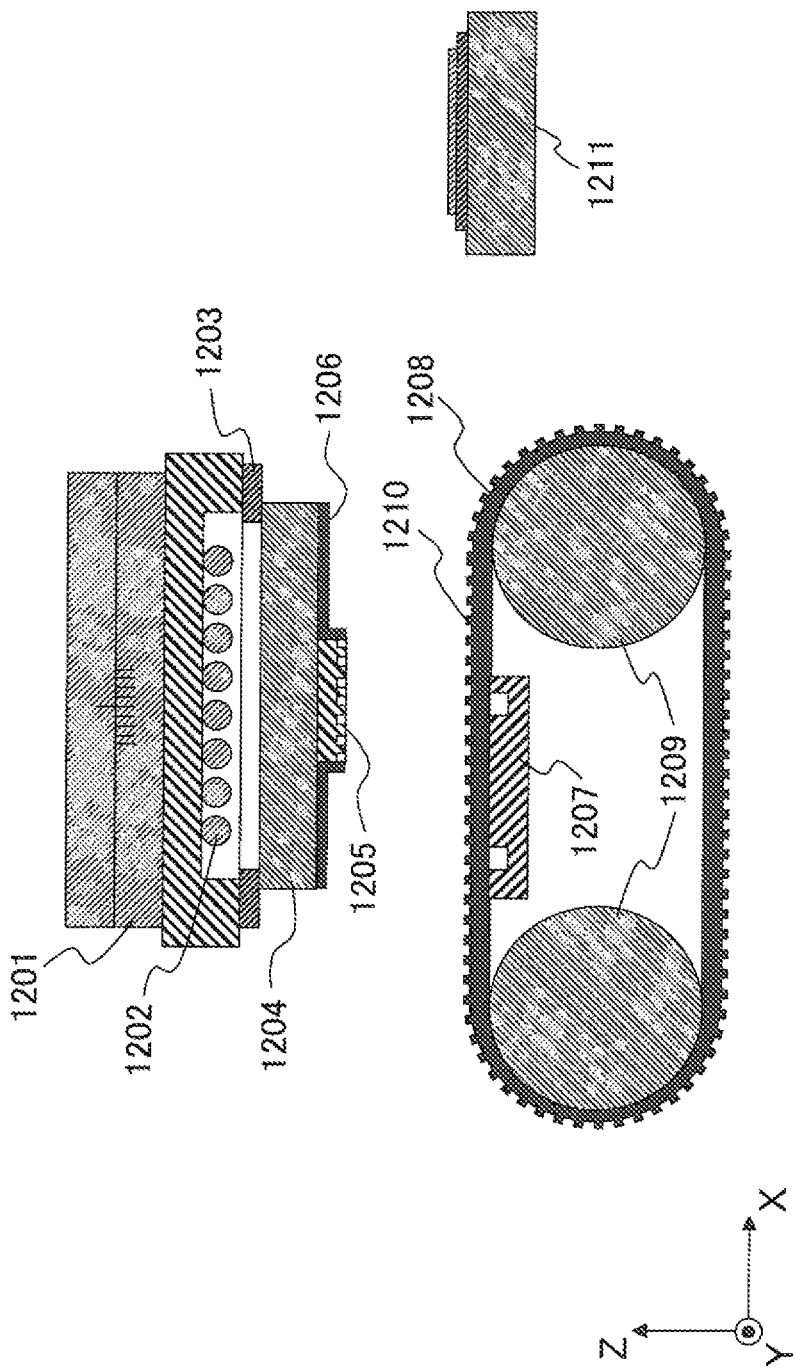
FIG. 12 is a schematic sectional view showing a manufacturing apparatus of a fine structure body according to a fourth embodiment of the present invention.

FIG. 12 is a schematic sectional view showing a forming apparatus of a fine structure body of the fourth embodiment according to the present invention. In FIG. 12, an ultraviolet-rays light source 1202 is disposed on a turn stage 1201 on a stage (not shown) which moves up and down, and fore and back. A silica glass board 1204 is attached on the turn stage 1201 through a gel-like cushion 1203, and the fine structure mold 1205 is attached to the silica glass board 1204 through a transparent double-stick tape that is not shown. A shade film 1206 is attached on the part, which is on a surface of the silica glass board 1204 facing a base material belt 1208, except the portion to which the fine structure mold 1205 is attached.

Further, the forming apparatus is provided with a face plate 1207, in which vacuum holding is possible, so as to face the fine structure mold 1205, and a seamless circular-shaped base material belt 1208 made of resin or metal is attached along its surface. The base material belt 1208 is given tension by two rollers 1209, the base material belt 1208 is moved by rotating of the roller 1209. A photocurable resin film 1210 with fluidity is applied to the surface of the surface of the base material belt 1208.

Further, the forming apparatus is provided with a dummy forming base material 1211, for the alignment at the time of mold exchange, at another position which is different from the position of the base material belt 1208.

A mold in which a fine reversal unevenness pattern (for example, line-and-space or hole shape) has been formed on a transparent material (for example, quartz glass or $SiO_2$ film) is used as the fine structure mold 1205 in the fourth embodiment.

This fine structure mold 1205 has been formed by, for example, processing a material with the outer diameter of 8 inches (20.3 cm) and the thickness of 0.525 mm, and producing a small piece mold cut out in a quadrangular shape or a hexagon such that the sides facing each other are parallel. After washing with a piranha solution, mold release processing is performed on this fine structure mold 1205. Novec EGC-1720 (registered trademark) manufactured by Sumitomo 3M Limited is used as a mold release agent. The shade film 1206 (the material is, for example, Al (aluminum) or Cr (chromium), and the thickness is about 100 nm.), which is formed by metallic film sputtering or metal deposition, is formed on a surface of the side face portions of the fine structure mold 1205. The photocurable resin film 1210 which has seeped out to the outer periphery of the mold is now not exposed to the ultraviolet rays due to the shade film 1206, and a range in which the photocurable resin film 1210 is hardened can be controlled. By means of this, a cured projection portion is not formed at the outer peripheral portion of the molded article, and it becomes possible to make the overlapping concerning the first forming step and the second forming step.

Figure 13:
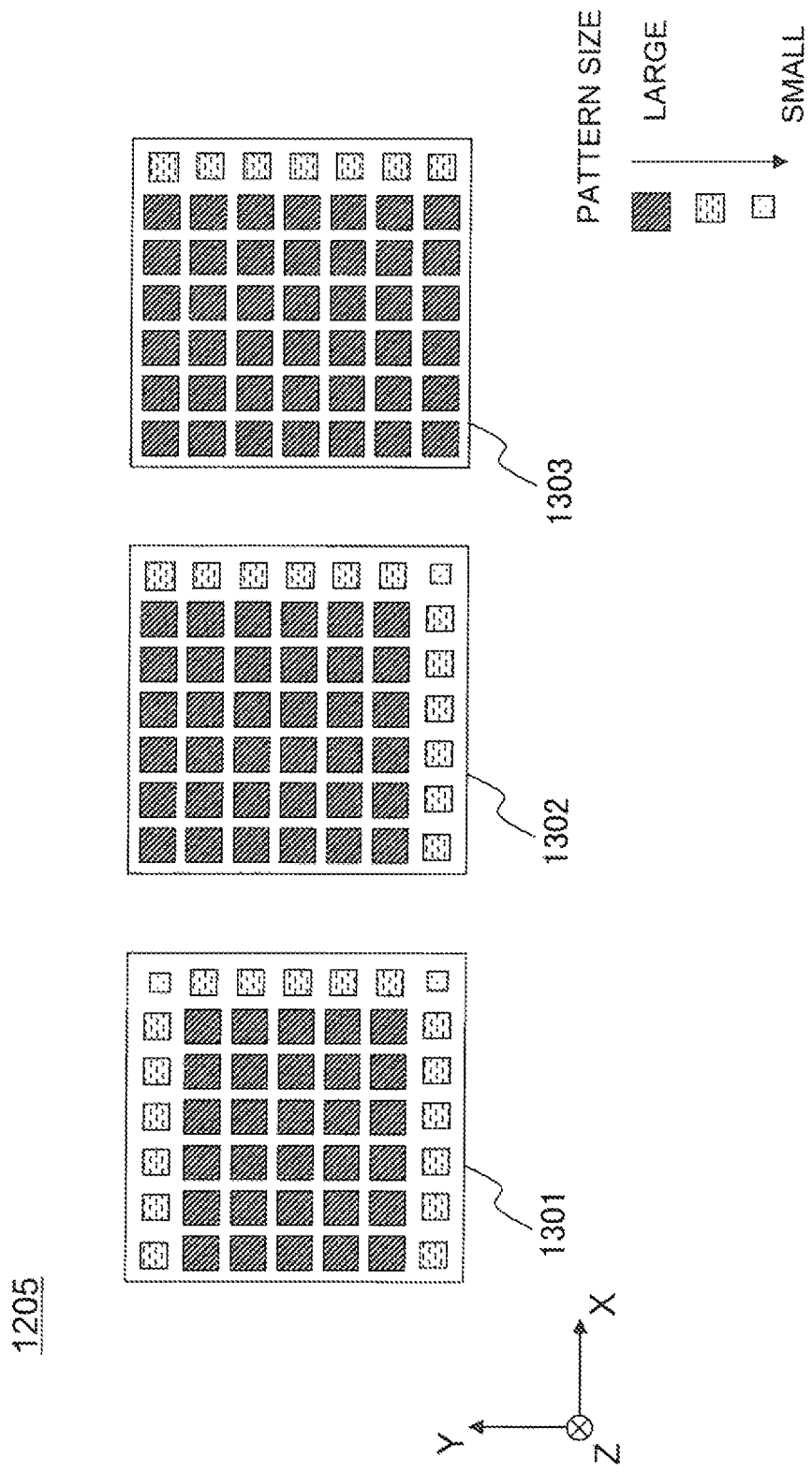
FIG. 13 is a schematic view showing three kinds of fine structure molds which are used in the fourth embodiment of the present invention.

In the present embodiment 4, three molds as a fine structure mold 1205 are used. FIG. 13 shows patterns of the three molds. A first fine structure mold 1301 is the mold in which the size of three side parts is small and the size of two corners is still smaller. A second fine structure mold 1302 is the mold in which the size of two side parts is small and the size of one corner is still smaller. A third fine structure mold 1303 is the mold in which the size of one side part is small.

A liquid radical polymerization monomer composition is used for the photocurable resin film 1210. When a resin layer is formed on the surface of the base material belt 1208, in order to prevent air entrainment, the application quantity of the photocurable resin film 1210 per surface of the fine structure mold 1205 is set slightly more than the volume of the depressed shape of the fine structure mold 1205. For the fine structure mold 1205, the inclination by the angle of 0.1 degrees or more and 5 degrees or less is provided to make the uncured photocurable resin generated in the first forming step flow to the region A in which the second forming step is carried out. The air, which intrudes easily between the fine structure mold 1205 and the base material belt 1208 during the pressing, is extruded by further extruding the uncured photocurable resin, which has flowed to this region A, in the second forming step. The application of the photocurable resin film 1210 is carried out by, for example, an inkjet method, a spin coating method, a spray coating method, and a bar coating method.

Figure 14:
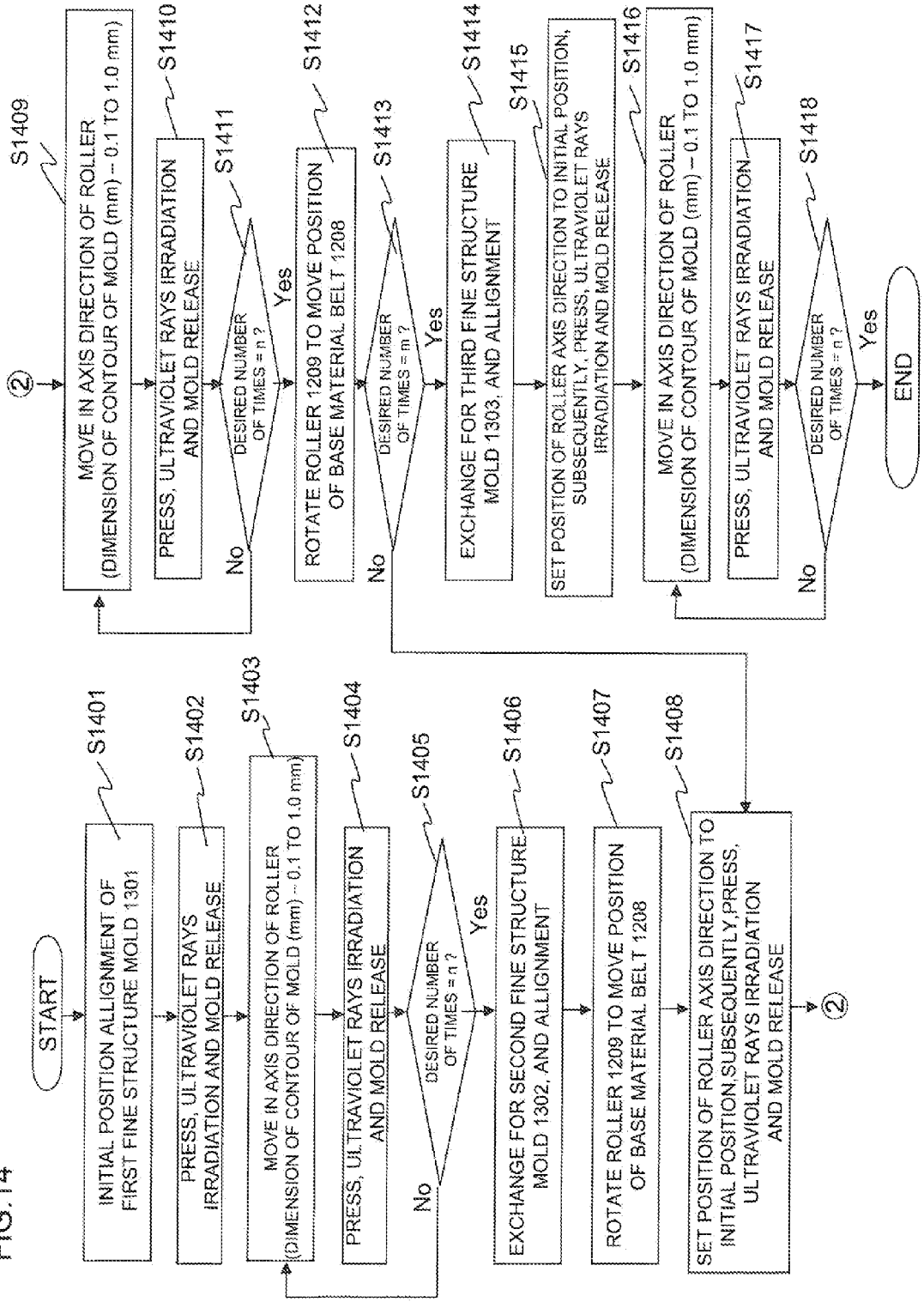
FIG. 14 is a flow chart showing a method for manufacturing the fine structure body according to the fourth embodiment of the present invention.
Figure 15:
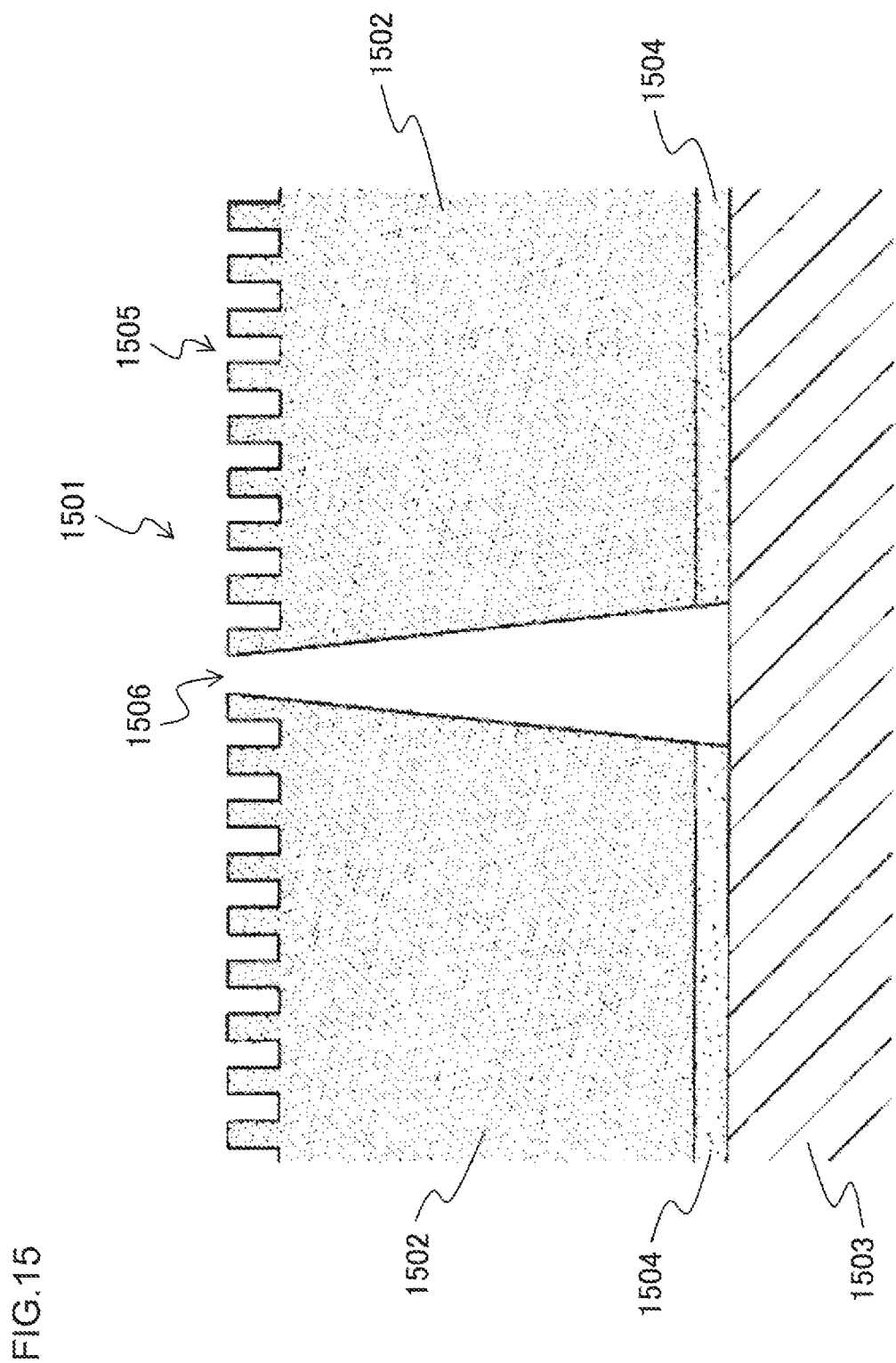
FIG. 15 is a schematic view showing a fine structure body which is disclosed by Japanese Laid-Open Patent Application No. 2010-80670.

FIG. 14 shows a flow chart showing a method for manufacturing the fine structure body according to the fourth embodiment.

(1) First, in the state in which the output of the ultraviolet-rays light source 1202 is turned OFF, the first fine structure mold 1301 is moved in an axis direction of the roller 1209 of FIG. 12 so as to be located at the initial position for forming, and the initial alignment is carried out (Step S1401).

(2) Subsequently, after the first fine structure mold 1301 described above is pressed against the photocurable resin film 1210 on the base material belt 1208, the output of the ultraviolet-rays light source 1202 is turned ON (Step S1402).

(3) Subsequently, the output of the ultraviolet-rays light source 1202 is turned OFF after the time required for exposure passes, and the first fine structure mold 1301 is released (Step S1402).

(4) Subsequently, the first fine structure mold 1301 is moved in an axis direction of the roller 1209 (Step S1403). At this time, the amount of the movement is a distance smaller by about 0.1 mm or more and 1 mm or less than the dimension of the contour of the first fine structure mold 1301 in order to perform the overlapping.

(5) Subsequently, after the first fine structure mold 1301 is pressed against the photocurable resin film 1210 on the base material belt 1208, the output of the ultraviolet-rays light source 1202 is turned ON (Step S1404).

(6) Subsequently, the output of the ultraviolet-rays light source 1202 is turned OFF after the time required for exposure passes, and the first fine structure mold 1301 is released (Step S1404).

(7) The above described items (4) to (6) are repeated predetermined number of times (Step S1405).

(8) Subsequently, a justification for the first fine structure mold 1301 and the second fine structure mold 1302 is performed on the dummy forming base material 1211 which has been disposed separately after exchanged for the second fine structure mold 1302 (Step S1406).

(9) Subsequently, the roller 1209 is rotated to move the position of the base material belt 1208 (Step S1407).

(10) Subsequently, in the state in which the output of the ultraviolet-rays light source 1202 is turned OFF, the second fine structure mold 1302 is moved in the axis direction of roller 1209 of FIG. 12 so as to be located at the initial position for forming. Subsequently, after the second fine structure mold 1302 is pressed against the photocurable resin film 1210 on the base material belt 1208, the output of the ultraviolet-rays light source 1202 is turned ON, and the output of the ultraviolet-rays light source 1202 is turned OFF after the time required for exposure passes, and the second fine structure mold 1302 is released (Step S1408).

(11) Subsequently, the second fine structure mold 1302 is moved in the axis direction of the roller 1209 (Step S1409). At this time, the amount of the movement is a distance smaller by about 0.1 mm or more and 1 mm or less than the dimension of the contour of the second fine structure mold 1302 in order to perform the overlapping.

(12) Subsequently, after the second fine structure mold 1302 is pressed against the photocurable resin film 1210 on the base material belt 1208, the output of the ultraviolet-rays light source 1202 is turned ON (Step S1410).

(13) Subsequently, the output of the ultraviolet-rays light source 1202 is turned OFF after the time required for exposure passes, and the second fine structure mold 1302 is released (Step S1410).

(14) The above described items (11) to (13) are repeated predetermined number of times (Step S1411).

(15) Subsequently, the roller 1209 is rotated to move the position of the base material belt 1208 (Step S1412).

(16) The above described items (10) to (15) are repeated predetermined number of times (Step S1413).

(17) Subsequently, a justification for the second fine structure mold 1302 and the third fine structure mold 1303 is performed on the dummy forming base material 1211 which has been disposed separately after exchanged for the third fine structure mold 1303 (Step S1414).

(18) Subsequently, in the state in which the output of the ultraviolet-rays light source 1202 is turned OFF, the third fine structure mold 1303 is moved in the axis direction of roller 1209 of FIG. 12 so as to be located at the initial position for forming. Subsequently, after the third fine structure mold 1303 is pressed against the photocurable resin film 1210 on the base material belt 1208, the output of the ultraviolet-rays light source 1202 is turned ON, and the output of the ultraviolet-rays light source 1202 is turned OFF after the time required for exposure passes, and the third fine structure mold 1303 is released (Step S1415).

(19) The third fine structure mold 1303 is moved in the axis direction of the roller 1209 (Step S1416). At this time, the amount of the movement is a distance smaller by about 0.1 mm or more and 1 mm or less than the dimension of the contour of the third fine structure mold 1303 in order to perform the overlapping.

(20) Subsequently, after the third fine structure mold 1303 is pressed against the photocurable resin film 1210 on the base material belt 1208, the output of the ultraviolet-rays light source 1202 is turned ON (Step S1417).

(21) Subsequently, the output of the ultraviolet-rays light source 1202 is turned OFF after the time required for exposure passes, and the third fine structure mold 1303 is released (Step S1417).

(22) By repeating the above described items (19) to (21) predetermined number of times, a circular-shaped continuous fine structure body is manufactured (Step S1418).

By performing the present embodiment 4, that is, by repeating the overlap transferring by using the small mold, it becomes possible to manufacture a circular-shaped continuous fine structure body with a little influence of the seam.

The present invention is useful for a surface texturing of an exterior molded article such as a surface decorating, for example.

DESCRIPTION OF SYMBOLS

101, 1201 Turn stage
102, 1202 Ultraviolet-rays light source
103, 1203 Gel-like cushion
104, 1204 Silica glass board
105, 700, 1001, 1205 Fine structure mold
105*a*, 700*a*, 1001*a* First mold depression pattern
105*b*, 700*b*, 1001*b* Second mold depression pattern
105Aa, 700Aa, First projection pattern
105Ab, 700Ab, Second projection pattern
105Aab, 700Aab First overlapping projection pattern
105A-1, 700A-1 Basic fine structure body by first forming step
105A-2, 700A-2 Basic fine structure body by second forming step
106, 1206 Shade film
107 Jig for fixing base material
108, 1503 Base material
109, 1210 Photocurable resin film
401 Photocurable resin
700*c*, 1001*c* Third mold depression pattern
705A-3 Basic fine structure body by third forming step
705A-4 Basic fine structure body by fourth forming step
700Abc Second overlapping projection pattern
700Aabc Third overlapping projection pattern
1001A Basic fine structure body
1207 Face plate
1208 Base material belt
1209 Roller
1211 Dummy molding base material
1301 First fine structure mold
1302 Second fine structure mold
1303 Third fine structure mold
1501 Fine structure
1502 Basic fine structure body
1504 Bonding agent layer
1505 Unevenness pattern
1506 Gap

What is claimed is:

1. A method of manufacturing a fine structure body which manufactures the fine structure body by repeating (i) a basic fine structure body forming step that forms a basic fine structure body by pressing a fine structure mold against a curable resin on a surface of a base material and (ii) a release and moving step that releases the fine structure mold from the base material and moves the fine structure mold, wherein
   the fine structure mold includes a planar mold surface and at least a first mold depression pattern which is disposed at a center area of the planar mold surface, and a second mold depression pattern which is disposed in at least one side part of the planar mold surface,
   a size of the second mold depression pattern is smaller than a size of the first mold depression pattern,
   when the planar mold surface of the fine structure mold is pressed against the curable resin on the base material, the planar mold surface of the fine structure mold is provided to lean by 0.1 degrees or more and 5.0 degrees or less against the surface of the base material,
   a first projection pattern and a second projection pattern are formed by pressing the first mold depression pattern and the second mold depression pattern against the curable resin on the surface of the base material, and the curable resin is made to flow into surroundings of the second projection pattern,
   the planar mold surface of the fine structure mold is moved to a position where the first mold depression pattern overlaps with the second projection pattern, and
   a first overlapping projection pattern is formed by pressing the first mold depression pattern against the second projection pattern and the curable resin of the surroundings of the second projection pattern.

2. A method of manufacturing a fine structure body which manufactures the fine structure body by repeating (i) a basic fine structure body forming step that forms a basic fine structure body by pressing a fine structure mold against a curable resin on a surface of a base material and (ii) a release and moving step that releases the fine structure mold from the base material and moves the fine structure mold, wherein the fine structure mold includes a planar mold surface and at least a first mold depression pattern which is disposed at a center area of the planar mold surface, and a second mold depression pattern which is disposed in at least one side part of the planar mold surface, a size of the second mold depression pattern is 50% or more and is 75% or less of a size of the first mold depression pattern, a first projection pattern and a second projection pattern are formed by pressing the first mold depression pattern and the second mold depression pattern against the curable resin on the surface of the base material, and the curable resin is made to flow into surroundings of the second projection pattern, the planar mold surface of the fine structure mold is moved to a position where the first mold depression pattern overlaps with the second projection pattern, and a first overlapping projection pattern is formed by pressing the first mold depression pattern against the second projection pattern and the curable resin of the surroundings of the second projection pattern.

3. The method of manufacturing the fine structure body according to claim 2, wherein the fine structure mold includes the first mold depression pattern, the second mold depression pattern and a third mold depression pattern which is disposed in at least one corner of the one side part at which the second mold depression pattern exists, and a size of the third mold depression pattern is smaller than the size of the second mold depression pattern.

4. The method of manufacturing the fine structure body according to claim 3, wherein the size of the second mold depression pattern is 50% or more and is 75% or less of the size of the first mold depression pattern, and the size of the third mold depression pattern is 50% or more and is 75% or less of the size of the second mold depression pattern.

5. The method of manufacturing the fine structure body according to claim 2, wherein an external contour of the fine structure mold is a hexagon, and the second mold depression patterns are disposed at three side parts of the circumference of the fine structure mold, the three sides being adjacent to each other.

6. The method of manufacturing the fine structure body according to claim 5, wherein a third mold depression pattern is provided and a size of which is smaller than the size of the second mold depression pattern, and the third mold depression patterns are disposed at corners where the two side parts of the adjoining three side parts of the fine structure mold, cross.

7. The method of manufacturing the fine structure body according to claim 2, wherein the base material is a seamless base material belt, and the fine structure body is a circular continuous fine structure body.

8. The method of manufacturing the fine structure body according to claim 1, wherein the fine structure mold includes the first mold depression pattern, the second mold depression pattern and a third mold depression pattern which is disposed in at least one corner of the one side part at which the second mold depression pattern exists, and a size of the third mold depression pattern is smaller than the size of the second mold depression pattern.

9. The method of manufacturing the fine structure body according to claim 1, wherein the base material is a seamless base material belt, and the fine structure body is a circular continuous fine structure body.

* * * * *